United States Patent
Hori et al.

(10) Patent No.: US 8,882,282 B2
(45) Date of Patent: Nov. 11, 2014

(54) METHOD OF MANUFACTURING OPTICAL PART AND OPTICAL PART, AND METHOD OF MANUFACTURING DISPLAY AND DISPLAY

(75) Inventors: Kazuhito Hori, Kanagawa (JP); Hiroshi Tanaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 177 days.

(21) Appl. No.: 13/121,887

(22) PCT Filed: Sep. 17, 2009

(86) PCT No.: PCT/JP2009/066233
§ 371 (c)(1),
(2), (4) Date: Mar. 30, 2011

(87) PCT Pub. No.: WO2010/038623
PCT Pub. Date: Apr. 8, 2010

(65) Prior Publication Data
US 2011/0181974 A1   Jul. 28, 2011

(30) Foreign Application Priority Data
Sep. 30, 2008  (JP) ................. 2008-252970

(51) Int. Cl.
*G02B 5/08* (2006.01)
*G02B 5/22* (2006.01)
*G02B 19/00* (2006.01)
*H01L 51/52* (2006.01)
*H01L 27/32* (2006.01)

(52) U.S. Cl.
CPC ........ *H01L 51/5271* (2013.01); *G02B 19/0028* (2013.01); *G02B 19/0047* (2013.01); *G02B 19/0095* (2013.01); *H01L 27/322* (2013.01);
*H01L 2251/5315* (2013.01); *H01L 27/3244* (2013.01); *G02B 19/0066* (2013.01)
USPC .......................................... 359/883; 359/888

(58) Field of Classification Search
USPC .......................................................... 359/883
See application file for complete search history.

(56) References Cited

U.S. PATENT DOCUMENTS

| 6,806,925 | B2 * | 10/2004 | Ishii et al. ..................... 349/106 |
| 7,879,390 | B2 * | 2/2011 | Salleo et al. ................... 427/162 |
| 2004/0108980 | A1 * | 6/2004 | Yonekubo et al. .............. 345/76 |
| 2006/0152931 | A1 * | 7/2006 | Holman ........................ 362/297 |
| 2008/0180026 | A1 | 7/2008 | Kondo et al. |

FOREIGN PATENT DOCUMENTS

| JP | 2001-201743 | 7/2001 |
| JP | 2001-242303 | 9/2001 |
| JP | 2005-227519 | 8/2005 |
| JP | 2006-088517 | 4/2006 |

(Continued)

*Primary Examiner* — Jade R Chwasz
(74) *Attorney, Agent, or Firm* — K&L Gates LLP

(57) ABSTRACT

In one embodiment, a light-emitting device includes an optical part which is configured to prevent the formation of a residual film and to enhance light extraction efficiency. In one embodiment, an optical part as a reflective plate is arranged on a light extraction side of a light-emitting panel. In one embodiment, a plurality of optical function elements are formed independently of one another on a base of the optical part. In one embodiment, a residual film which is an optically unnecessary part between the base and the plurality of optical function elements is eliminated to prevent unnecessary light guiding, reflection or the like to the residual film. In one embodiment, in a light-emitting device including the optical part, stray light due to unnecessary light guiding or reflection to the residual film is reduced, and an improvement in light extraction efficiency achievable.

9 Claims, 23 Drawing Sheets

(56) References Cited

FOREIGN PATENT DOCUMENTS

| JP | 2006091447 A | * | 4/2006 |
| JP | 2007-248484 | | 9/2007 |
| JP | 2007-305508 | | 11/2007 |
| JP | 2008-204948 | | 9/2008 |

* cited by examiner (A)

(B)

METHOD OF MANUFACTURING OPTICAL PART AND OPTICAL PART, AND METHOD OF MANUFACTURING DISPLAY AND DISPLAY

CROSS REFERENCE TO RELATED APPLICATIONS

The present application is a National Stage of International Application No. PCT/JP2009/066233 filed on Sep. 17, 2009, which claims priority to Japanese Patent Application No. 2008-252970 filed on Sep. 30, 2008, the entire contents of which are being incorporated herein by reference

BACKGROUND

A self-luminous element such as an organic light-emitting element includes a first electrode, an organic layer including a light-emitting layer and a second electrode in order on a substrate, and when a DC voltage is applied between the first electrode and the second electrode, electron-hole recombination occurs in the light-emitting layer to emit light. The emitted light may be extracted from a side closer to the first electrode and the substrate, but the emitted light may be extracted from a side closer to the second electrode, that is, a side opposite to a side closer to a circuit including a TFT (Thin Film Transistor) or wiring so as to increase an aperture ratio.

As an example of a display using a self-luminous element, there is a display using an organic light-emitting element (for example, refer to PTL 1). However, in the display in related art, light emitted from a light-emitting device is not extracted from the device due to total reflection or the like, and light use efficiency of the display is not good. Therefore, it is proposed that an optical part called a reflective plate (reflector) is arranged directly above an organic light-emitting element to achieve an improvement in light extraction efficiency (for example, refer to PTL 2). The optical part is formed by arranging a plurality of projected optical function elements on a base made of glass or the like, and reflecting mirror films are formed on side surfaces of the optical function elements.

As a method of manufacturing such an optical part in related art, an injection molding method, a hot-embossing method, a nano-imprinting method, a melt fine-transfer method (for example, refer to PTL 3) or the like is used.

CITATION LIST

Patent Literature

[PTL 1] Japanese Unexamined Patent Application Publication No. 2005-227519
[PTL 2] Japanese Unexamined Patent Application Publication No. 2007-248484
[PTL 3] Japanese Unexamined Patent Application Publication No. 2006-88517

SUMMARY

The present disclosure relates to a method of manufacturing an optical part, and an optical part having optical functions such as reflection and dispersion, and a method of manufacturing a display, and a display including the optical part.

However, in these methods in related art, a residual film derived from a molding process remains between the base and the optical function elements, and the optical function elements are in a state where bottoms thereof are connected to one another by the residual film.

The present disclosure is made to solve the above-described issue, and it is an object of the disclosure to provide a method of manufacturing an optical part, and an optical part allowed to prevent the formation of a residual film, and a method of manufacturing a display, and a display.

A method of manufacturing an optical part according to an example embodiment of the disclosure includes the following steps (A) to (D):]\

(A) a step of forming a die including a plurality of through holes;
(B) a step of superimposing the die and a base on each other so that a front surface of the die is in contact with the base and applying an uncured material from a back surface of the die;
(C) a step of removing the uncured material extended to the back surface of the die; and
(D) a step of curing the uncured material in the plurality of through holes to form a plurality of optical function elements independently of one another on the base.

An optical part according to an example embodiment of the disclosure includes a base; and a plurality of optical function elements formed independently of one another on the base.

A method of manufacturing a display according to an example embodiment of the disclosure includes: a step of forming a light-emitting panel including a plurality of self-luminous elements on a substrate; a step of forming an optical part; and a step of arranging the optical part on a light extraction side of the light-emitting panel, in which the step of forming the optical part includes the steps (A) to (D) of the above-described method of manufacturing an optical part.

A display according to an example embodiment of the disclosure includes: a light-emitting panel including a plurality of self-luminous elements on a substrate; and an optical part arranged on a light extraction side of the light-emitting panel, in which the optical part is configured of the above-described optical part.

In the optical part of the disclosure, a plurality of optical function elements are formed independently of one another on the base; therefore, a residual film which is an optically unnecessary part between the base and the plurality of optical function elements is eliminated, and unnecessary light guiding, reflection or the like to the residual film is prevented. Therefore, when the display is configured by using the optical part, stray light due to unnecessary light guiding or reflection to the residual film is reduced, and an improvement in light extraction efficiency is achievable.

According to the method of manufacturing an optical part of the disclosure or the method of manufacturing a display of the disclosure, the die including a plurality of through holes is formed, and the die and the base are superimposed on each other, and the uncured material is applied from the back surface of the die, and the uncured material extended to the back surface of the die is removed; therefore, optical function elements are allowed to be formed independently of one another directly on the base without leaving the residual film.

According to the optical part of the disclosure, a plurality of optical function elements are formed independently of one another on the base; therefore, the residual film which is an optically unnecessary part between the base and the plurality of optical function elements is allowed to be eliminated, and unnecessary light guiding, reflection or the like to the residual film is preventable. Therefore, when a display is configured by using the optical part, stray light due to unnecessary light guiding or reflection to the residual film is reduced, and an improvement in light extraction efficiency is achievable.

Additional features and advantages are described herein, and will be apparent from the following Detailed Description and the figures

DETAILED DESCRIPTION

A preferred example embodiment will be described in detail below referring to the accompanying drawings.

The following example embodiment focuses on an influence of a residual film, which is inevitably formed in a manufacturing method in related art, on light extraction efficiency, and is made to prevent the formation of the residual film. Therefore, before describing a specific example embodiment, a difference in light extraction efficiency depending on the thickness of the residual film will be described below as an underlying premise of the disclosure based on a simulation result.

Figure 1:
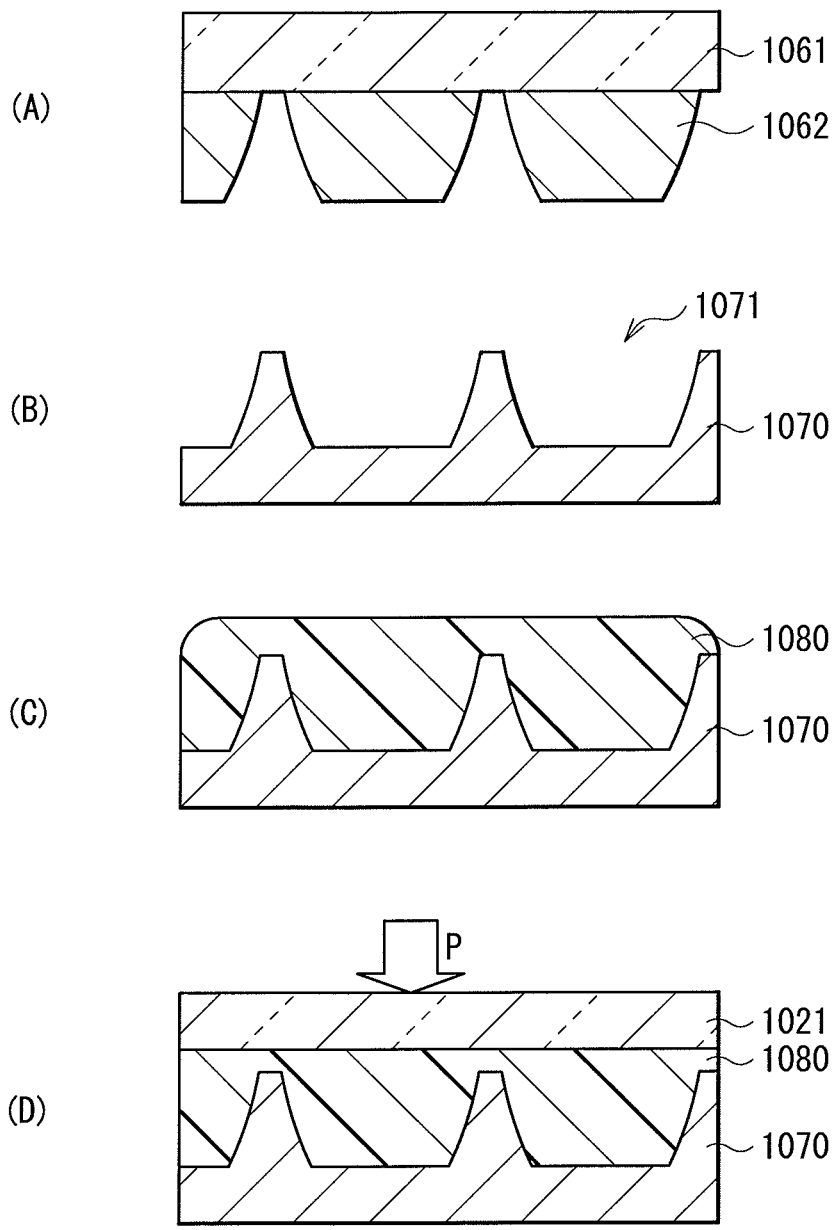
FIG. 1 is a sectional view illustrating a method of manufacturing an optical part in related art in order of steps.
Figure 2:
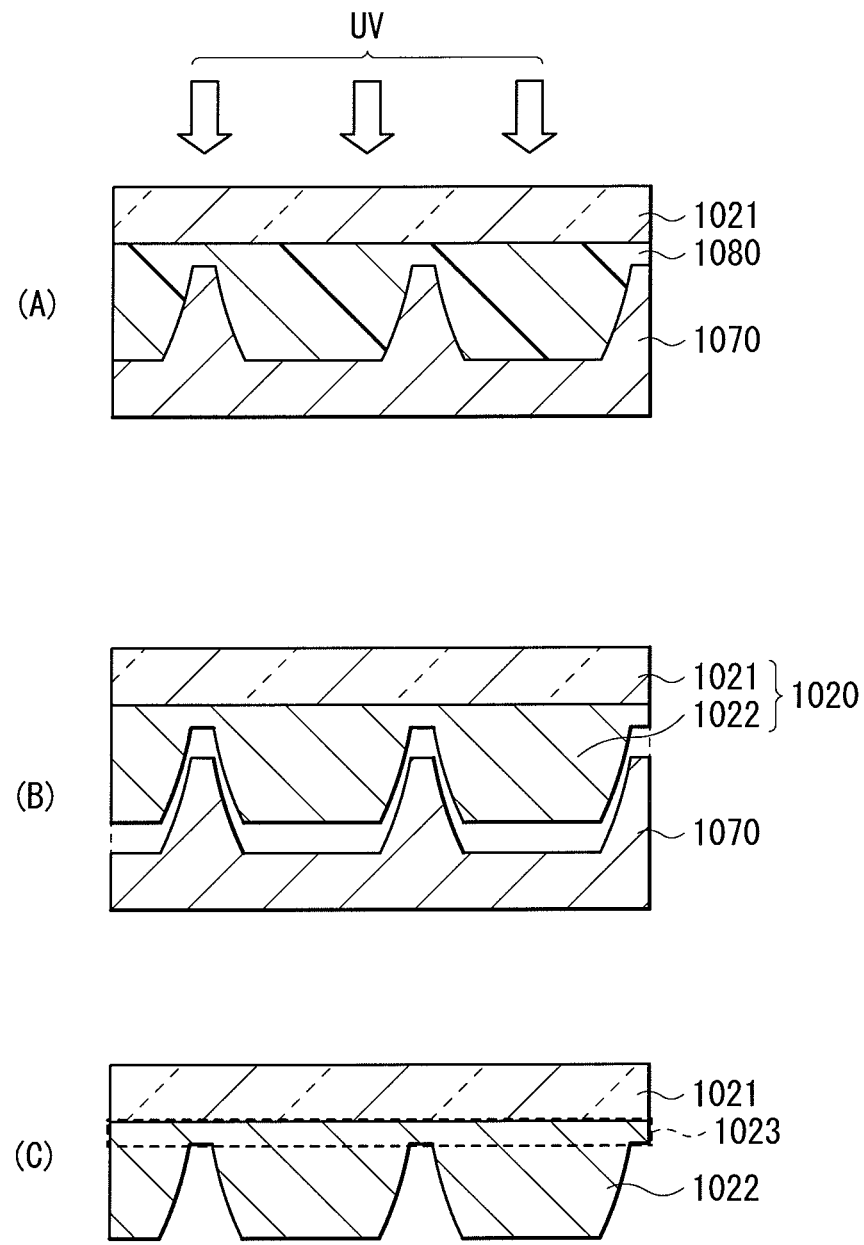
FIG. 2 is a sectional view illustrating steps following FIG. 1.

FIGS. 1 and 2 illustrate a method of manufacturing an optical part 1020 by a nano-imprinting method in related art in order of steps. First, as illustrated in FIG. 1(A), a mother die 1060 including a plurality of projections 1062 made of a resist on a glass substrate 1061 is formed. Next, as illustrated in FIG. 1(B), a die 1070 including a plurality of depressions 1071 is formed by electroforming with use of the mother die 1060. Then, as illustrated in FIG. 1(C), an ultraviolet-curable resin 1080 is applied to the die 1070, and as illustrated in FIG. 1(D), a base 1021 made of a transparent substrate such as glass is placed on the ultraviolet-curable resin 1080 to apply pressure P to the ultraviolet-curable resin 1080. After that, as illustrated in FIG. 2(A), ultraviolet rays UV are applied to the ultraviolet-curable resin 1080 from the base 1021 side to cure the ultraviolet-curable resin 1080, thereby forming an optical part 1020 including optical function elements 1022 on the base 1021. Next, as illustrated in FIG. 2(B), the optical part 1020 is separated from the die 1070. In the optical part 1020 obtained in such a manner, as illustrated in FIG. 2(C), a residual film 1023 remains at the bottoms of the optical function elements 1022.

As described in steps illustrated in FIGS. 1(C) and 1(D), the ultraviolet-curable resin 1080 is supplied to a surface 1070A where the depressions 1071 are formed of the die 1070, and is pressurized between the die 1070 and the base 1021. Therefore, even if molding is performed at any high pressure, the residual film 1023 inevitably remains between the surface 1070A of the die 1070 and the base 1021.

Figure 3:
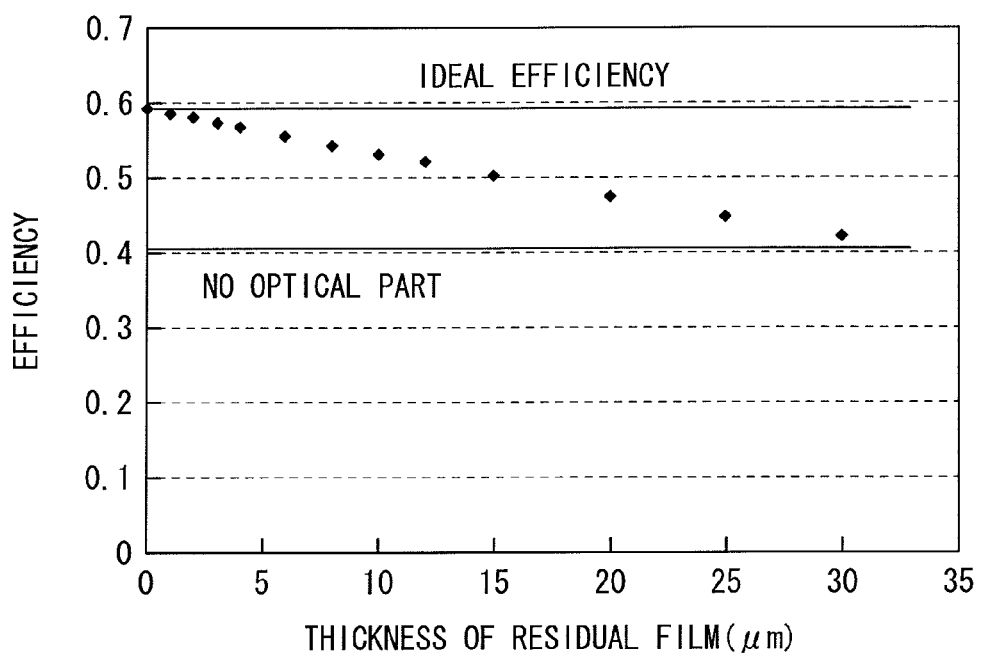
FIG. 3 is a diagram illustrating a relationship between the thickness of a residual film and light extraction efficiency in the optical part in related art.

The residual film 1023 is an optically unnecessary part, and there is an issue that desired final characteristics are not obtained due to an influence of light guiding, reflection or the like to the residual film 1023. FIG. 3 illustrates a simulation result of determining a relationship between the thickness of the residual film 1023 and light extraction efficiency in the case where the obtained optical part 1020 is arranged on a light extraction side of an organic light-emitting element. Light extraction efficiency in the case where the optical part 1020 is not arranged is approximately 40%, and ideal efficiency is 60%. The larger the thickness of the residual film 1023 is, the more the light extraction efficiency is reduced from the ideal efficiency. For example, in the case of the residual film 1023 with a thickness of 15 μm, the light extraction efficiency is reduced from the ideal efficiency by approximately 17%.

A specific embodiment will be described below based on the simulation result and analysis thereof.

Figure 4:
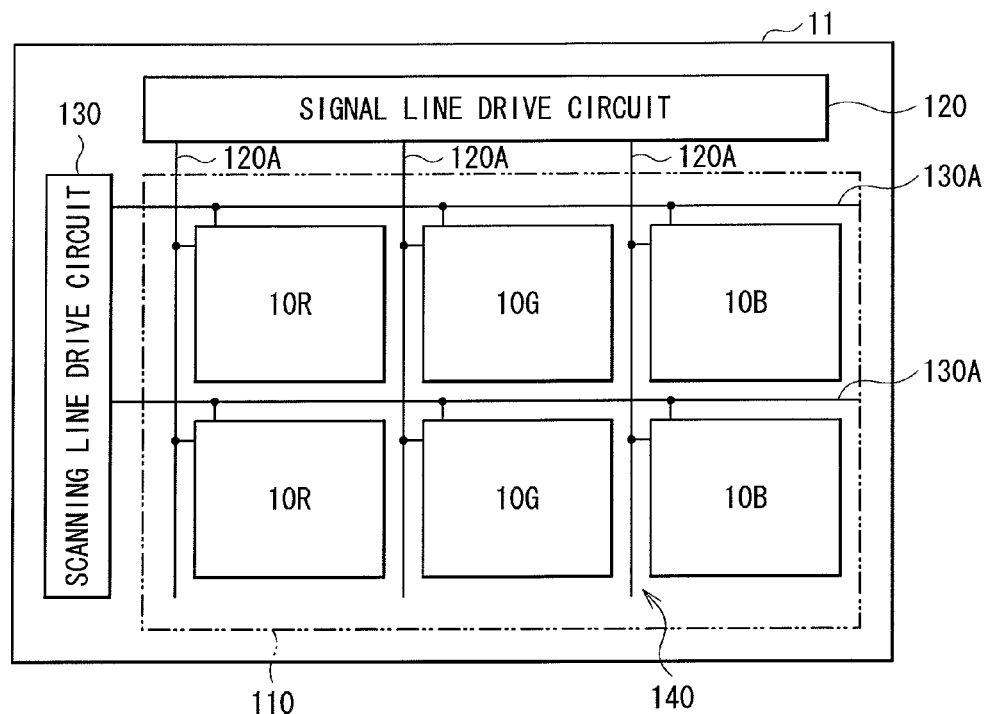
FIG. 4 is a diagram illustrating a configuration of a display according to an example embodiment of the disclosure.

FIG. 4 illustrates a configuration of a display according to an example embodiment of the disclosure. The display is used as an ultrathin color organic light-emitting display or the like, and is configured by forming a display region 110 in which a plurality of organic light-emitting elements 10R, 10G and 10B which will be described later are arranged in a matrix on a drive substrate 11 made of, for example, glass, a silicon (Si) wafer or a resin and forming a signal line drive circuit 120 and a scanning line drive circuit 130 as drivers for picture display around the display region 110.

Figure 5:
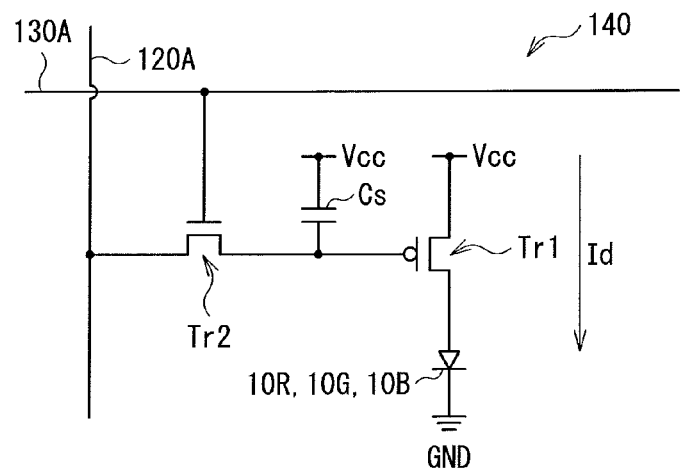
FIG. 5 is an equivalent circuit diagram illustrating an example of a pixel drive circuit illustrated in FIG. 4.

A pixel drive circuit 140 is formed in the display region 110. FIG. 5 illustrates an example of the pixel drive circuit 140. The pixel drive circuit 140 is formed below a first electrode 13 which will be described later, and is an active drive circuit including a driving transistor Tr1 and a writing transistor Tr2, a capacitor (retention capacitor) Cs between the driving transistor Tr1 and the writing transistor Tr2, the organic light-emitting element 10R (or 10G or 10B) connected to the driving transistor Tr1 in series between a first power source line (Vcc) and a second power source line (GND). The driving transistor Tr1 and the writing transistor Tr2 each are configured of a typical thin film transistor (TFT), and the TFT may have, for example, an inverted staggered configuration (a so-called bottom gate type) or a staggered configuration (a top gate type), and the configuration of the TFT is not specifically limited.

In the pixel drive circuit 140, a plurality of signal lines 120A are arranged in a column direction, and a plurality of scanning lines 130A are arranged in a row direction. An intersection between each signal line 120A and each scanning line 130A corresponds to one (a subpixel) of the organic light-emitting elements 10R, 10G and 10B. Each signal line 120A is connected to the signal line drive circuit 120, and an image signal is supplied from the signal line drive circuit 120 to a source electrode of the writing transistor Tr2 through the signal line 120A. Each scanning line 130A is connected to the scanning line drive circuit 130, and a scanning signal is sequentially supplied from the scanning line drive circuit 130 to a gate electrode of the writing transistor Tr2 through the scanning line 130A.

Figure 6:
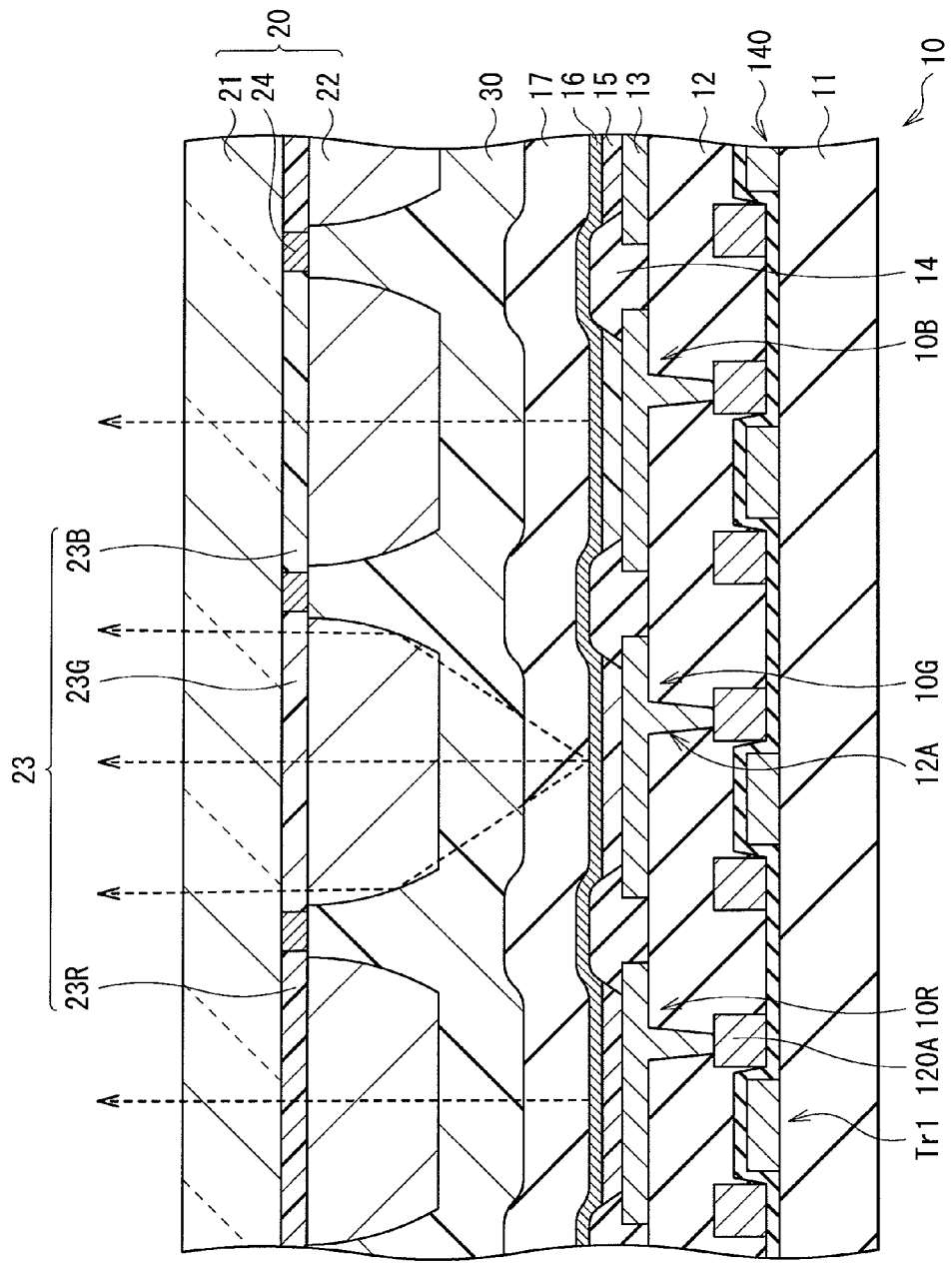
FIG. 6 is a sectional view illustrating a configuration in a display region of the display illustrated in FIG. 4.

FIG. 6 illustrates a sectional configuration in the display region 110 of the display illustrated in FIG. 4. The display includes an optical part 20 as a reflective plate (reflector) on a light extraction side of a light-emitting panel 10. The light-emitting panel 10 and the optical part 20 are bonded together with an adhesive layer 30 such as a thermosetting resin or an ultraviolet curable resin.

The light-emitting panel 10 is configured by forming organic light-emitting elements 10R emitting red light, organic light-emitting elements 10G emitting green light and organic light-emitting elements 10B emitting blue light in order in a matrix as a whole on the drive substrate 11. Note that the organic light-emitting elements 10R, 10G and 10B each have a rectangular planar shape, and a combination of adjacent organic light-emitting elements 10R, 10G and 10B configures one pixel.

The organic light-emitting elements 10R, 10G and 10B each have a configuration in which the first electrode 13 as an anode, an insulating film 14, an organic layer 15 including a light-emitting layer which will be described later, and a second electrode 16 as a cathode are laminated in this order from the drive substrate 11 side with the above-described pixel drive circuit 140 and a planarization layer 12 in between, and if necessary, the organic light-emitting elements 10R, 10G and 10B are covered with a protective film 17.

The planarization layer 12 is a base layer for planarizing a surface of the drive substrate 11 on which the pixel drive circuit 140 is formed and forming each layer of the organic light-emitting elements 10R, 10G and 10B so as to have a uniform thickness. The planarization layer 12 includes connection holes 13A connecting the first electrodes 13 of the organic light-emitting elements 10R, 10G and 10B and the signal lines 120A. As very thin connection holes 12A are formed in the planarization layer 12, the planarization layer 12 is preferably made of a material with high pattern accuracy. The planarization layer 12 is made of a photosensitive resin such as polyimide, polybenzoxazole, acrylic or novolac.

The first electrodes 13 are formed so as to correspond to the organic light-emitting elements 10R, 10G and 10B, respectively, and are electrically separated from one another by the insulating film 14. Moreover, the first electrodes 13 have a function as a reflective electrode reflecting light emitted from the light-emitting layer, and it is desirable that the first electrodes 13 have as high reflectivity as possible so as to enhance light emission efficiency. The first electrodes 13 each have, for example, a thickness of 100 nm to 1000 nm both inclusive, and are made of aluminum (Al) or an alloy including aluminum (Al), or silver (Ag) or an alloy including silver (Ag). Moreover, the first electrodes 13 may be made of a simple substance or an alloy of any other metal element such as chromium (Cr), titanium (Ti), iron (Fe), cobalt (Co), nickel (Ni), molybdenum (Mo), copper (Cu), tantalum (Ta), tungsten (W), platinum (Pt) or gold (Au).

The insulating film 14 is provided to secure insulation between the first electrode 13 and the second electrode 16 and to accurately have a desired shape of a light emission region, and is made of, for example, an organic material such as photosensitive acrylic, polyimide or polybenzoxazole or an inorganic insulating material such as silicon oxide ($SiO_2$). The insulating film 14 has openings corresponding to light emission regions of the first electrodes 13. Note that the organic layer 15 and the second electrode 16 may be continuously arranged on not only the light emission regions but also on the insulating film 14, but light is emitted only from the openings of the insulating film 14.

The organic layer 15 has, for example, a configuration in which a hole injection layer, a hole transport layer, a light-emitting layer and an electron transport layer are laminated in order from the first electrode 13 side, but any of these layers except for the light-emitting layer may be arranged as necessary. Moreover, the organic layer 15 may have a different configuration depending on colors of light emitted from the organic light-emitting elements 10R, 10G or 10B. The hole injection layer is provided to enhance hole injection efficiency, and is a buffer layer for preventing leakage. The hole transport layer is provided to enhance the hole transport efficiency to the light-emitting layer. The light-emitting layer emits light by the recombination of electrons and holes in response to the application of an electric field. The electron transport layer is provided to enhance electron transport efficiency to the light-emitting layer. In addition, an electron injection layer (not illustrated) made of LiF, $Li_2O$ or the like may be arranged between the electron transport layer and the second electrode 16.

Examples of the material of the hole injection layer of the organic light-emitting element 10R include 4,4'4"-tris(3-methylphenylphenylamino)triphenylamine (m-MTDATA) and 4,4'4"-tris(2-naphthylphenylamino)triphenylamine (2-TNATA). Examples of the material of the hole transport layer of the organic light-emitting element 10R include bis[(N-naphthyl)-N-phenyl]benzidine (α-NPD). Examples of the material of the light-emitting layer of the organic light-emitting element 10R include an 8-quinolinol aluminum complex (Alq$_3$) mixed with 40 vol % of 2,6-bis[4-[N-(4-methoxyphenyl)-N-phenyl]aminostyryl]naphthalene-1,5-dicarbonitrile (BSN-BCN). Examples of the material of the electron transport layer of the organic light-emitting element 10R include Alq$_3$.

Examples of the material of the hole injection layer of the organic light-emitting element 10G include m-MTDATA and 2-TNATA. Examples of the material of the hole transport layer of the organic light-emitting element 10G include α-NPD. Examples of the material of the light-emitting layer of the organic light-emitting element 10G include Alq$_3$ mixed with 3 vol % of Coumarin6. Examples of the material of the electron transport layer of the organic light-emitting element 10G include Alq$_3$.

Examples of the material of the hole injection layer of the organic light-emitting element 10B include m-MTDATA and 2-TNATA. Examples of the material of the hole transport layer of the organic light-emitting element 10B include α-NPD. Examples of the material of the light-emitting layer of the organic light-emitting element 10B include spiro6Φ. Examples of the material of the electron transport layer of the organic light-emitting element 10B include Alq$_3$.

The second electrode 16 has, for example, a thickness of 5 nm to 50 nm both inclusive, and is made of a simple substance or an alloy of a metal element such as aluminum (Al), magnesium (Mg), calcium (Ca) or sodium (Na). In particular, the second electrode 16 is preferably made of an alloy of magnesium and silver (a MgAg alloy) or an alloy of aluminum (Al) and lithium (Li) (an AlLi alloy). Moreover, the second electrode 16 may be made of ITO (indium-tin complex oxide) or IZO (indium-zinc complex oxide).

The protective film 17 has, for example, a thickness of 500 nm to 10000 nm both inclusive, and is made of silicon oxide (SiO$_2$), silicon nitride (SiN) or the like.

The optical part 20 is arranged on the light extraction side, that is, the second electrode 16 side of the light-emitting panel 10, and has a function as a reflective plate (reflector) enhancing light extraction efficiency from the organic light-emitting elements 10R, 10G and 10B. The optical part 20 has a configuration in which a plurality of optical function elements 22 are formed independently of one another on a base 21. In other words, bottom surfaces of the plurality of optical function elements 22 are in direct contact with the base 21 without the residual film in related art in between. Therefore, in the optical part 20, the residual film between the base 21 and the optical functional elements 22 is allowed to be eliminated.

The base 21 is made of, for example, glass, a resin substrate or a resin film of a heat-resistant resin, or fused silica.

The optical function elements 22 each have, for example, a truncated cone shape, and a top surface of the optical function element 22 is a flat surface and has a smaller area than a bottom surface thereof. A side surface of the optical function element 22 may be, for example, a linearly tapered side surface or an aspherical side surface. The optical function elements 22 are made of a resin such as an ultraviolet-curable resin or a thermosetting resin, but the optical function elements 22 may be made of low-melting glass. In terms of an improvement in light extraction efficiency, as necessary, a reflecting mirror film (not illustrated) made of aluminum (Al), silver (Ag), an alloy including aluminum (Al), an alloy including silver (Ag) or the like is preferably formed on the side surface of the optical function element 22. Moreover, an embedded layer (not illustrated) made of a resin or the like may be formed in spaces between the optical function elements 22.

Figure 7:
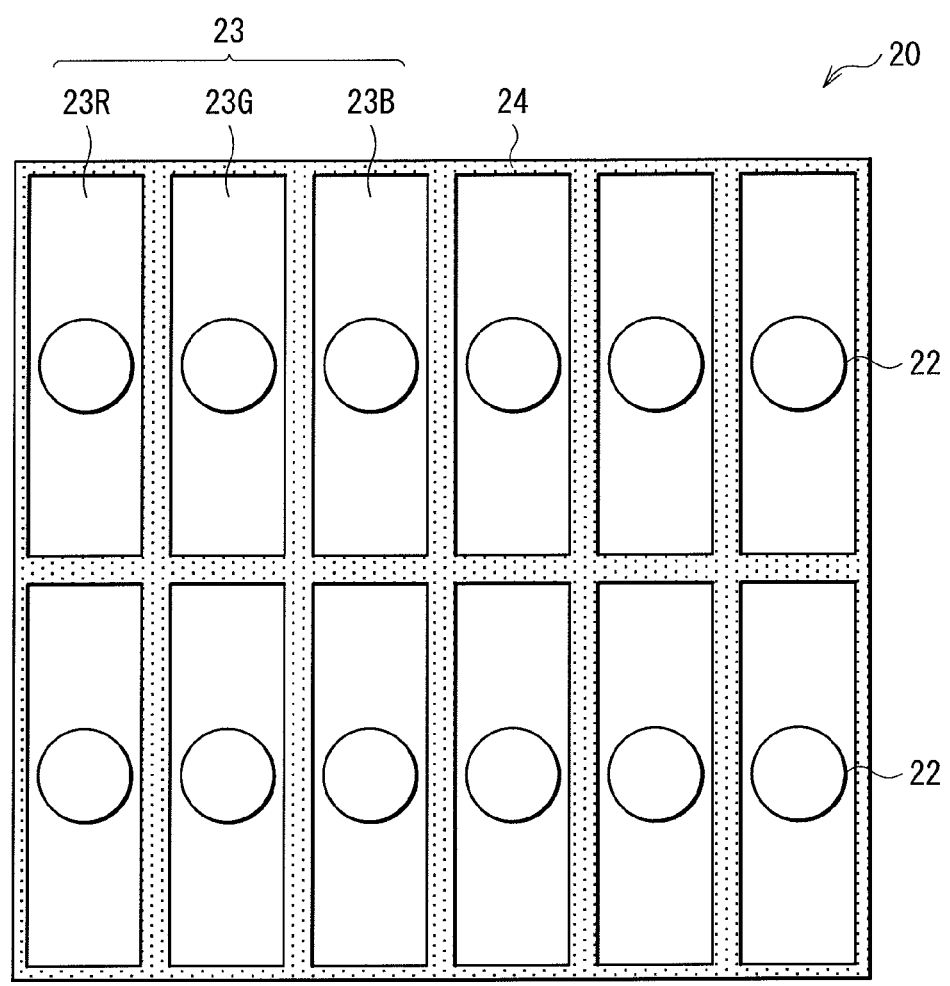
FIG. 7 is a plan view illustrating a configuration of the optical part illustrated in FIG. 6 when viewed from an optical function element side.

FIG. 7 illustrates a planar configuration of the optical part 20 when viewed from the optical function element 22 side. For example, a color filter 23 and a light-shielding film 24 as a black matrix are arranged on the base 21 to extract light emitted from the organic light-emitting elements 10R, 10G and 10B and absorb outside light reflected from the organic light-emitting elements 10R, 10G and 10B and wiring therebetween, thereby improving contrast.

The color filter 23 is formed below the optical function elements 22 and includes red filters 23R, green filters 23G and blue filters 23B which are arranged corresponding to the organic light-emitting elements 10R, 10G and 10B, respectively. The red filters 23R, the green filters 23G and the blue filters 23B each have, for example, a rectangular shape, and are arranged without space. The red filters 23R, the green filters 23G and the blue filters 23B are made of a resin mixed with a pigment of a corresponding color, and are adjusted by selecting the pigment so that light transmittance in a target red, green or blue wavelength region is high and light transmittance in other wavelength regions is low.

The light-shielding film 24 is arranged along boundaries of the red filters 23R, the green filters 23G and the blue filters 23B. The light-shielding film 24 is configured of, for example, a black resin film mixed with a black colorant with an optical density of 1 or over, or a thin-film filter using interference of a thin film. In particular, the light-shielding film 24 is preferably configured of the black resin film, because the light-shielding film 24 is easily formed at low cost. The thin-film filter is formed, for example, by laminating one or more thin films made of metal, a metal nitride or a metal oxide, and uses interference of the thin film to attenuate light. More specifically, as the thin-film filter, a thin-film filter formed by alternately laminating chromium and chromium (III) oxide ($Cr_2O_3$) is cited. Note that the light-shielding film 24 is not necessarily provided.

The display is allowed to be manufactured by, for example, the following steps.

Figure 8:
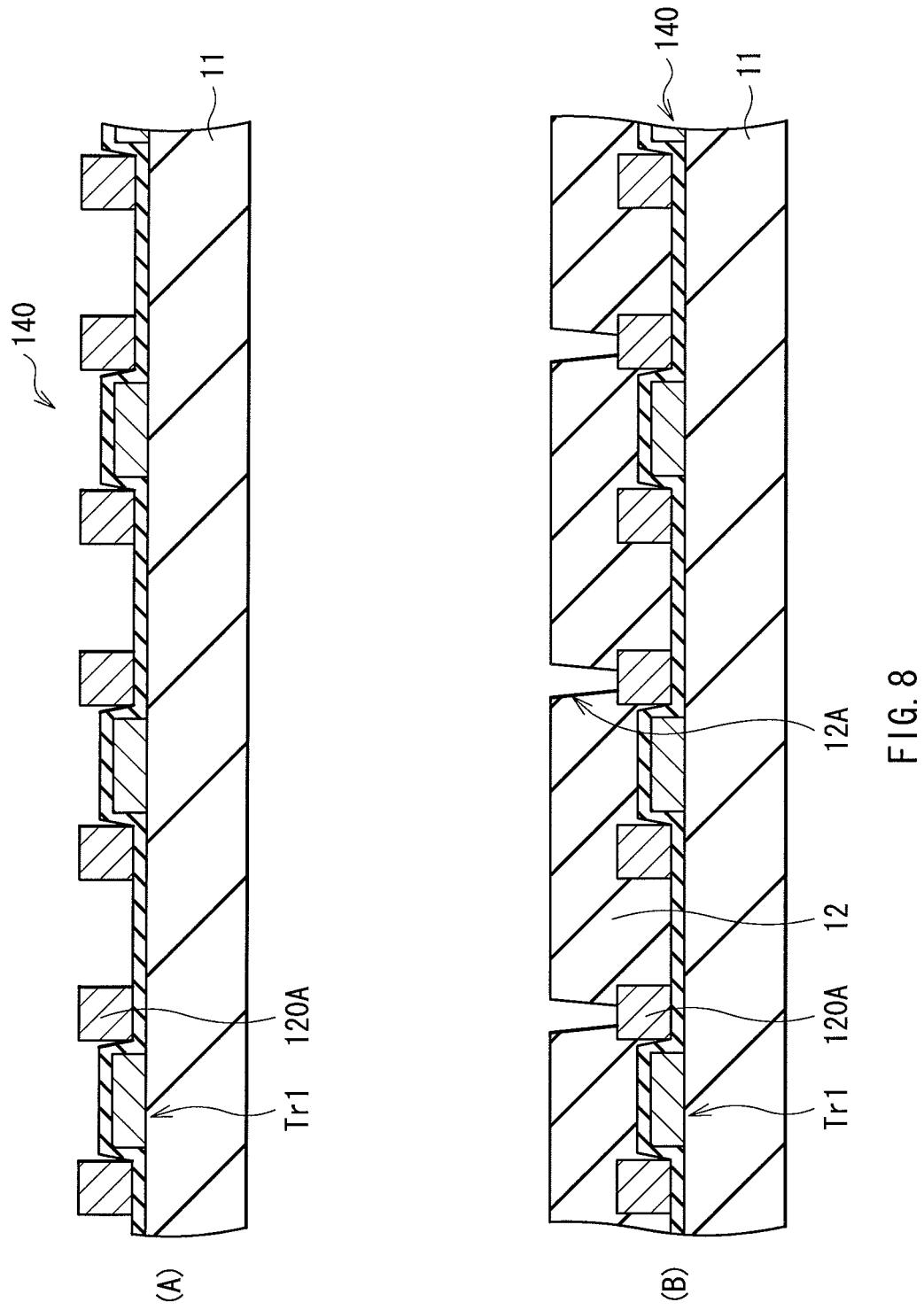
FIG. 8 is a sectional view illustrating a method of manufacturing the display illustrated in FIG. 6 in order of steps.
Figure 9:
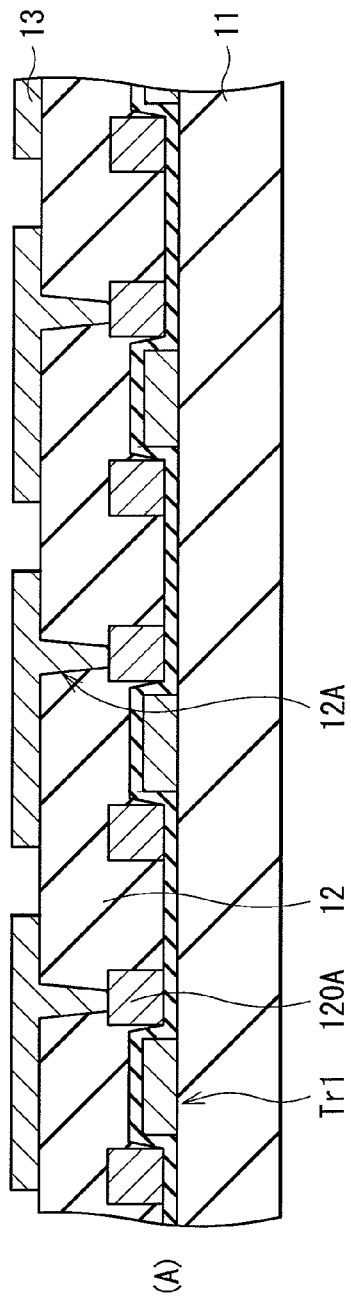
FIG. 9 is a sectional view illustrating steps following FIG. 8.
Figure 9:
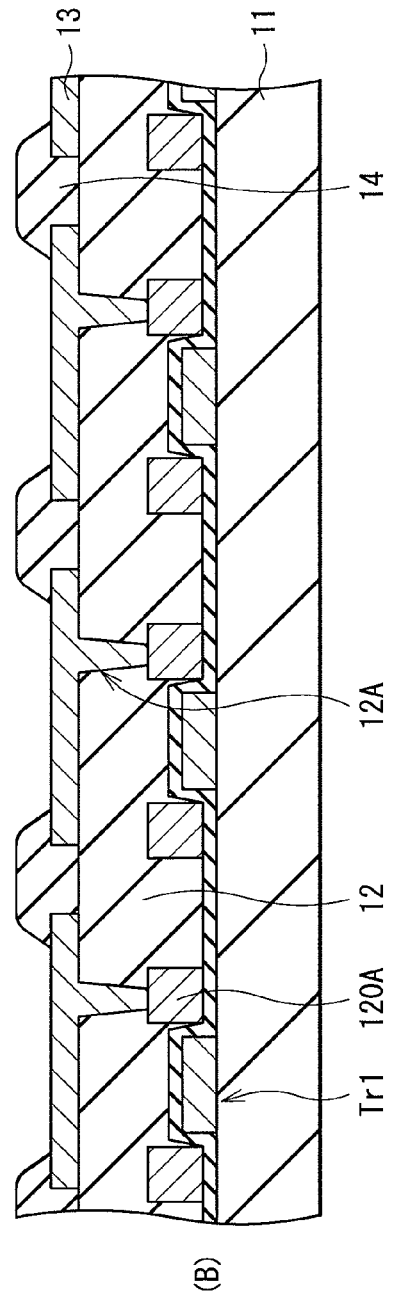
Figure 10:
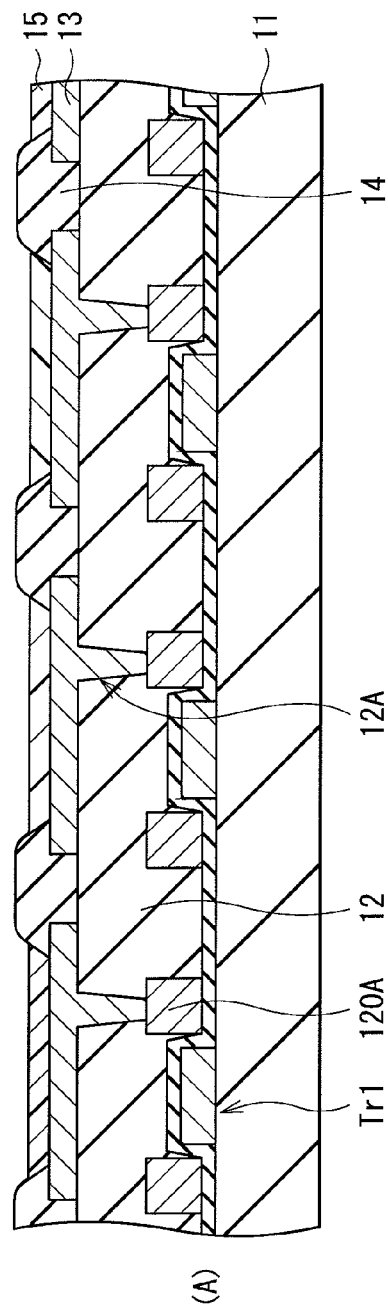
FIG. 10 is a sectional view illustrating steps following FIG. 9.
Figure 10:
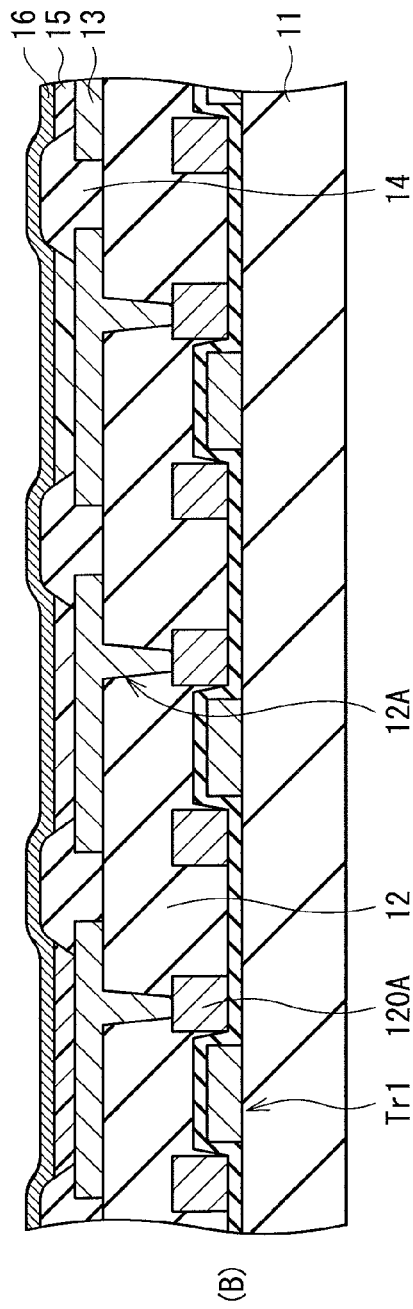

FIGS. 8 to 22 illustrate a method of manufacturing the display in order of steps. First, as illustrated in FIG. 8(A), the pixel drive circuit 140 is formed on the drive substrate 11 made of the above-described material.

Next, as illustrated in FIG. 8(B), the planarization layer 12 made of, for example, a photosensitive polyimide is formed on the whole surface of the drive substrate 11 through coating by, for example, a spin coating method, and the planarization layer 12 is patterned into a predetermined shape by exposure to light and development, and connection holes 12A are formed, and then the planarization layer 12 is fired.

Next, as illustrated in FIG. 9(A), the first electrodes 13 made of, for example, the above-described material with the above-described thickness are formed on the planarization layer 12 by, for example, a sputtering method, and then the first electrodes 13 are patterned into a predetermined shape by, for example, a lithography technique and etching. Thus, a plurality of first electrodes 13 are formed on the planarization layer 12.

After that, as illustrated in FIG. 9(B), the whole surface of the drive substrate 11 is coated with a photosensitive resin, and openings are formed in the photosensitive resin by exposure to light and development, and then the photosensitive resin is fired to form the insulating film 14.

Next, as illustrated in FIG. 10(A), the hole injection layer, the hole transport layer, the light-emitting layer and the electron transport layer, which are made of the above-described materials with the above-described thicknesses, of the organic light-emitting element 10R are formed in order by, for example, a vacuum deposition method so as to form the organic layer 15 of the organic light-emitting element 10R. After that, also as illustrated in FIG. 10(A), as in the case of the organic layer 15 of the organic light-emitting element 10R, the hole injection layer, the hole transport layer, the light-emitting layer and the electron transport layer, which are made of the above-described materials with the above-described thicknesses, of the organic light-emitting element 10G are formed in order to form the organic layer 15 of the organic light-emitting element 10G. Next, also as illustrated in FIG. 10(A), as in the case of the organic layer 15 of the organic light-emitting element 10R, the hole injection layer, the hole transport layer, the light-emitting layer and the electron transport layer, which are made of the above-described materials with the above-described thicknesses, of the organic light-emitting element 10B are formed in order to form the organic layer 15 of the organic light-emitting element 10B.

After the organic layers 15 of the organic light-emitting elements 10R, 10G and 10B are formed, as illustrated in FIG. 10(B), the second electrode 16 made of the above-described material with the above-described thickness is formed on the whole surface of the drive substrate 11 by, for example, an evaporation method. Thus, the organic light-emitting elements 10R, 10G and 10B illustrated in FIGS. 4 and 6 are formed.

Figure 11:
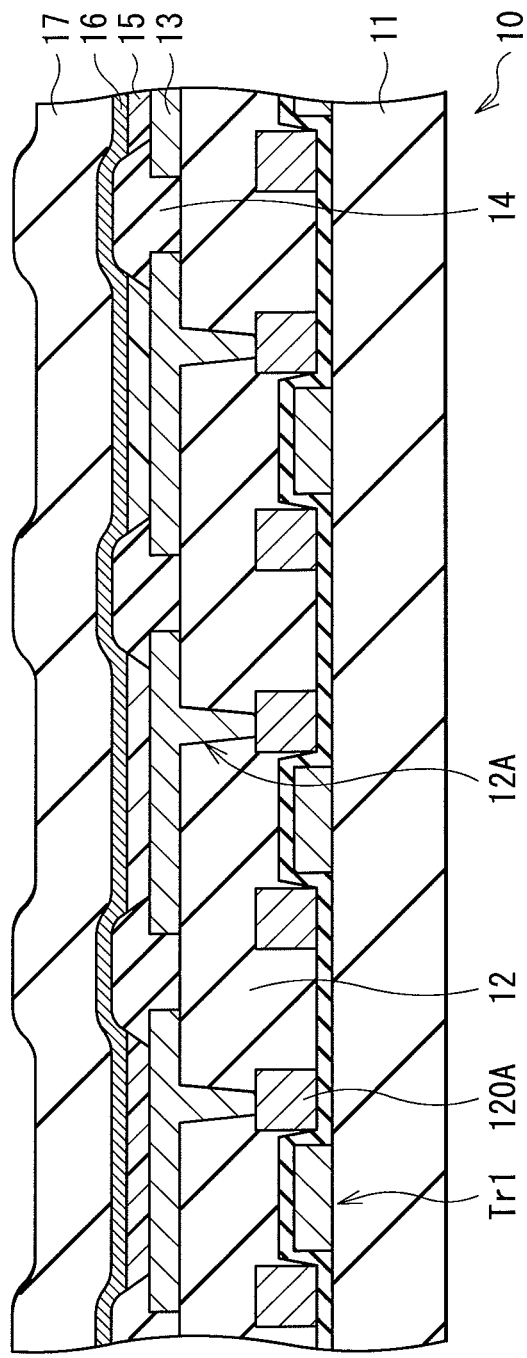
FIG. 11 is a sectional view illustrating a step following FIG. 10.

Next, as illustrated in FIG. 11, the protective film 17 made of the above-described material with the above-described thickness is formed on the second electrode 16. Thus, the light-emitting panel 10 illustrated in FIG. 6 is formed.

Figure 12:
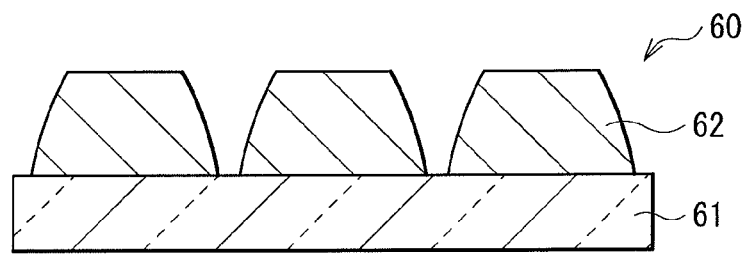
FIG. 12 is a sectional view illustrating a step following FIG. 11.

Moreover, the optical part 20 is formed. First, as illustrated in FIG. 12, a glass substrate 61 is coated with a resist with use of, for example, a slit coater, and the resist is patterned with use of, for example, a photolithography technique to form the mother die 60 including a plurality of projections 62.

Figure 13:
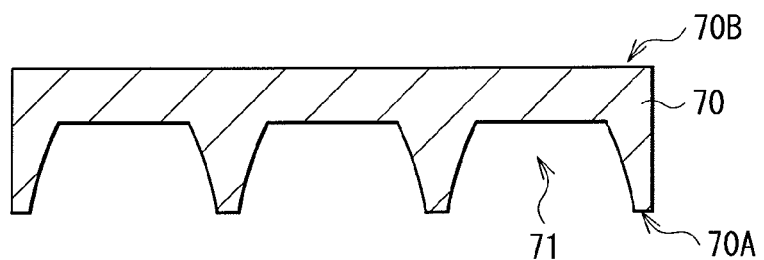
FIG. 13 is a sectional view illustrating a step following FIG. 12.
Figure 14:
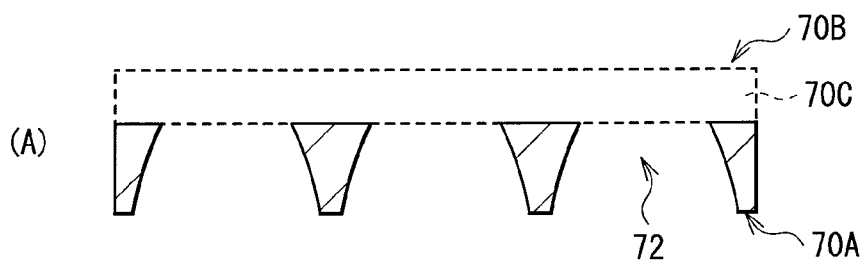
FIG. 14 is a sectional view illustrating a step following FIG. 13.
Figure 14:
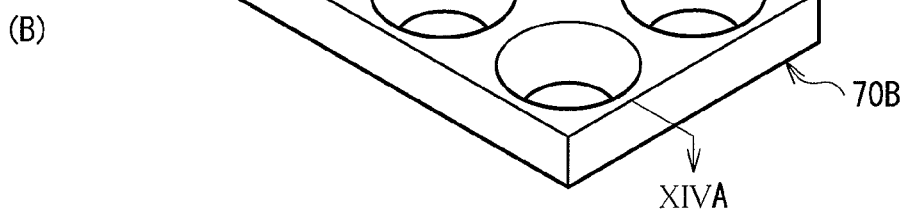
Figure 15:
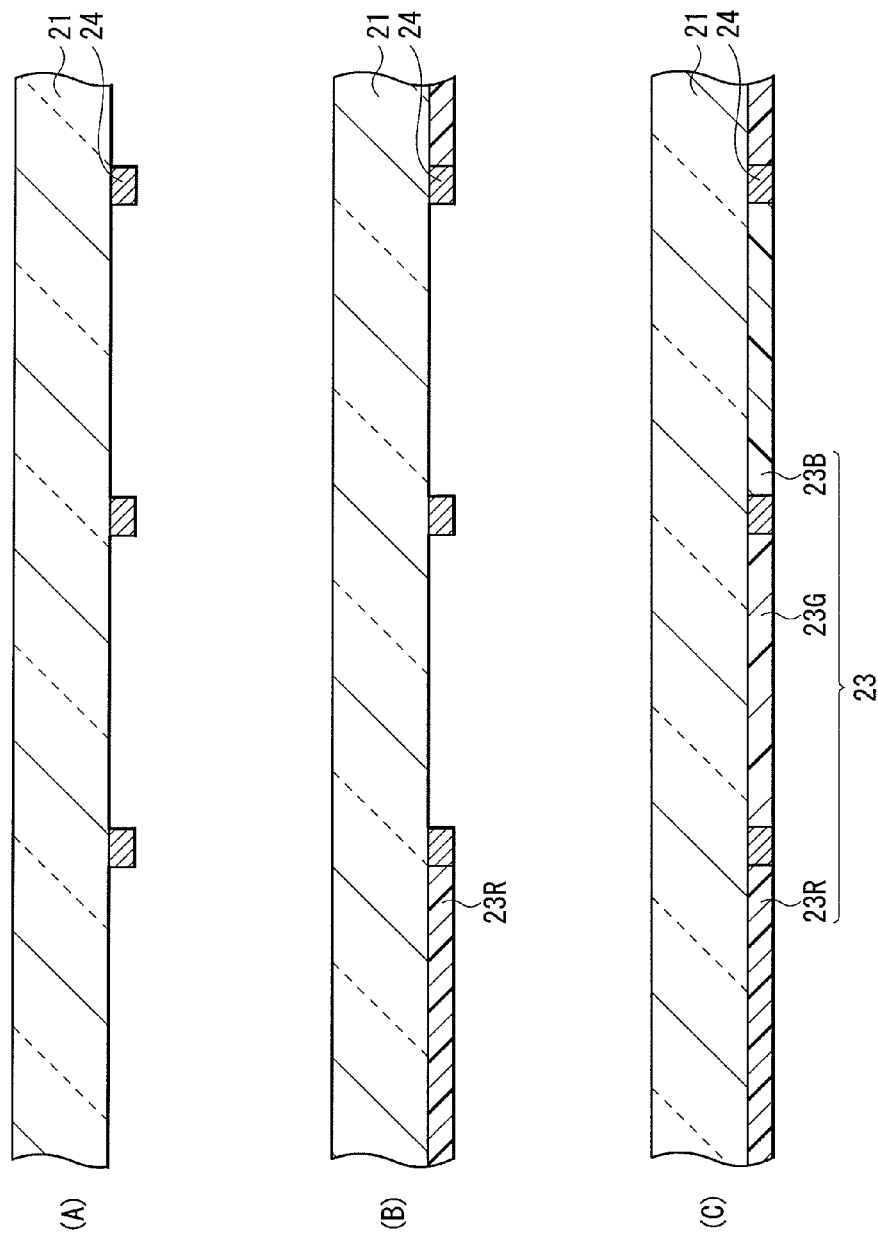
FIG. 15 is a sectional view illustrating steps following FIG. 14.
Figure 16:
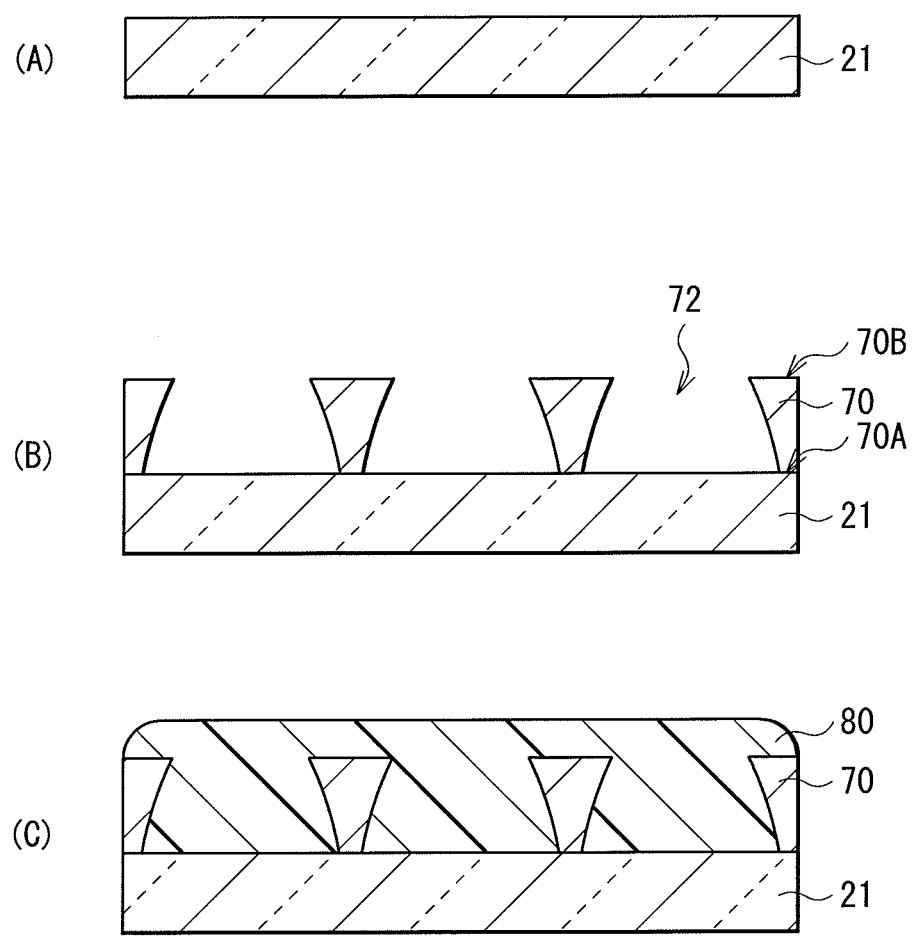
FIG. 16 is a sectional view illustrating steps following FIG. 15.
Figure 17:
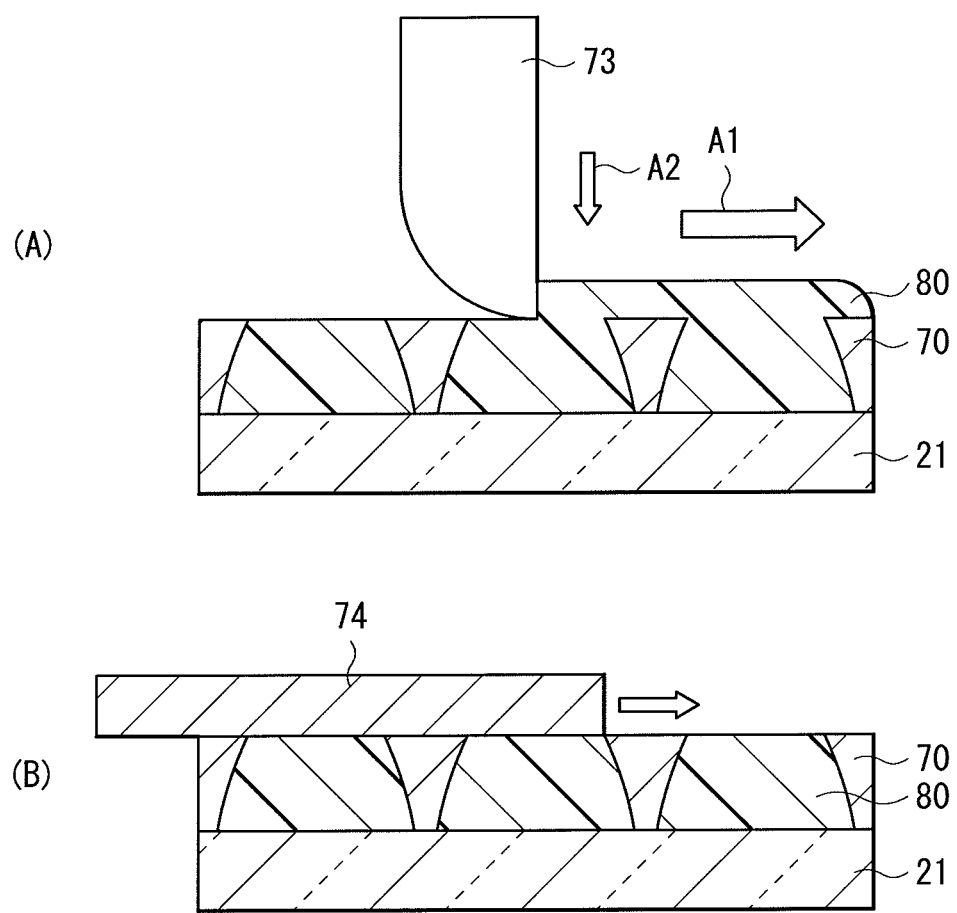
FIG. 17 is a sectional view illustrating steps following FIG. 16.

Next, as illustrated in FIG. 13, a die 70 made of nickel (Ni) or copper (Cu) is formed by electroforming with use of the mother die 60. A plurality of depressions 71 with the same shape as that of the projection 62 are formed on a front surface 70A of the die 70.

Then, as illustrated in FIGS. 14(A) and 14(B), a part 70C between a back surface 70B of the die 70 and the bottom surfaces of the plurality of depressions 71 is removed to transform the plurality of depressions 71 into a plurality of through holes 72. At this time, to accurately maintain a desired molding height throughout the die 70, it is desirable to use a CMP (Chemical Mechanical Polishing) method, a plane polishing machine or the like as a fine polishing method.

After that, as illustrated in FIG. 15(A), the light-shielding film 24 made of the above-described material is formed on the base 21 made of the above-described material, and is patterned into a predetermined shape. Next, as illustrated in FIG. 15(B), the material of the red filter 23 is applied to the base 21 by spin coating or the like, and the material is patterned by a photolithography technique and fired to form the red filter 23R. At the time of patterning, an edge part of the red filter 23R may be laid over the light-shielding film 24. Next, as illustrated in FIG. 15(C), as in the case of the red filter 23R, the blue filter 23B and the green filter 23G are formed in order. Thus, the color filter 23 and the light-shielding film 24 are formed on the surface of the base 21.

After the color filter 23 and the light-shielding film 24 are formed on the base 21, as illustrated in FIG. 16(A), to improve adhesion to a resin, precision cleaning for improving wettability is performed. Moreover, it is desirable to improve adhesion to the ultraviolet-curable resin to be used in a following step with use of silane coupling agent (HMDS; hexamethyldisilazane or the like). Note that in FIG. 16(A) and later drawings, the color filter 23 and the light-shielding film 24 are not illustrated.

Next, the die 70 is set to a stamper holder in a transfer device and is aligned to a predetermined reference position in advance. After that, as illustrated in FIG. 16(B), the die 70 and the base 21 are superimposed on each other so that the front surface 70A of the die 70 is in contact with the base 21. In addition, in the case where precise positioning of the base 21 and the die 70 is necessary depending on applications, an alignment mark (not illustrated) on the base 21 is read out by a CCD (Charge Coupled Device) camera or the like to perform alignment with the die 70. Moreover, it is desirable to adhere the whole surface of the die 70 and the whole surface of the base 21 to each other without space in the transfer device.

After that, as illustrated in FIG. 16(C), for example, an ultraviolet-curable resin 80 as an uncured material is applied from the back surface 70B side of the die 70. For example, the ultraviolet-curable resin 80 having viscosity (a CP value is, for example, approximately a few tens to a few hundreds) controlled to an extent to which the ultraviolet-curable resin 80 enters into the through holes 72 of the die 70 and does not flow into a gap between the die 70 and the base 21 is used to perform coating on a whole surface of the substrate 21 with a coater die or the like.

Next, as illustrated in FIG. 17(A), the excess ultraviolet-curable resin 80 extending to the back surface 70B of the die 70 is removed by a movement (in a direction of an arrow A1) of tracing the back surface 70B of the die 70 with use of, for example, a squeegee 73. At the same time, with use of the squeegee 73, the ultraviolet-curable resin 80 in the through holes 72 is allowed to be pressurized in a direction of an arrow A2, and a top surface of the ultraviolet-curable resin 80 is also allowed to be planarized. Note that it is desirable to use the squeegee 73 immediately after coating with the ultraviolet-curable resin 80.

After that, as illustrated in FIG. 17(B), a shutter 74 is slid so as to adhere to the back surface 70B of the die 70, and the whole back surface 70B of the die 70 is covered with the shutter 74, and moderate pressure is applied to the base 21. The top surface of the ultraviolet-curable resin 80 may be planarized by the squeegee 73, or by the shutter for process simplification.

Figure 18:
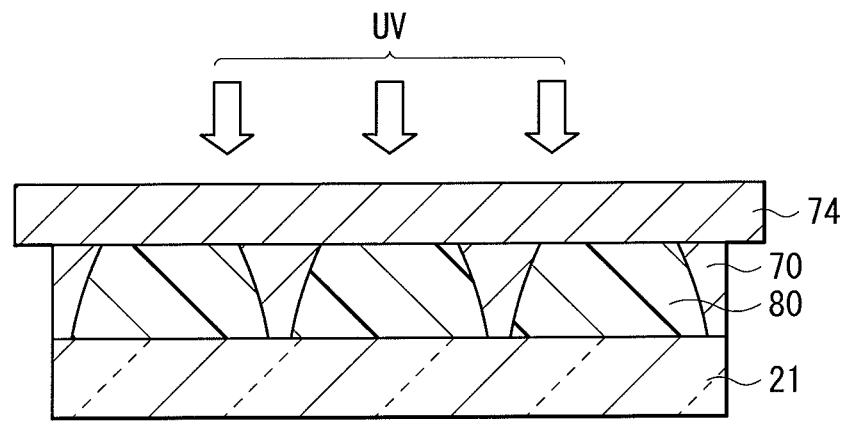
FIG. 18 is a sectional view illustrating a step following FIG. 17.

In this state, as illustrated in FIG. 18, ultraviolet rays UV are applied to cure the ultraviolet-curable resin 80B in the through holes 72. At this time, the color filter 23 and the light-shielding film 24 are formed on the base 21; therefore, it is preferable that the shutter 74 is made of a transparent material to the ultraviolet rays UV and the ultraviolet rays UV are applied from the shutter 74 side.

Figure 19:
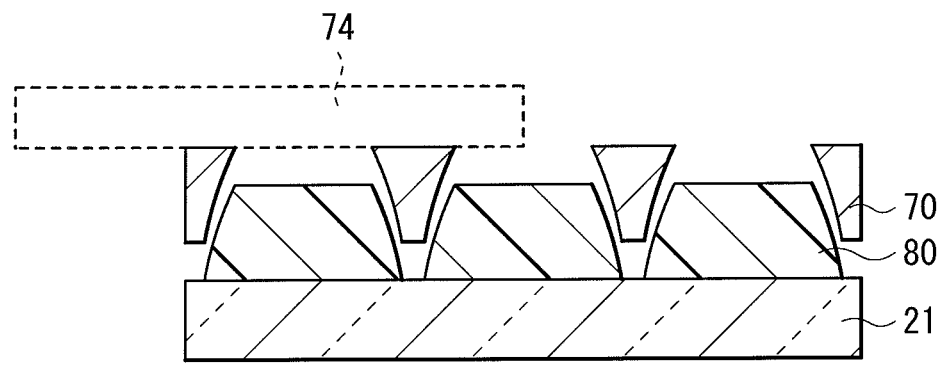
FIG. 19 is a sectional view illustrating a step following FIG. 18.
Figure 20:
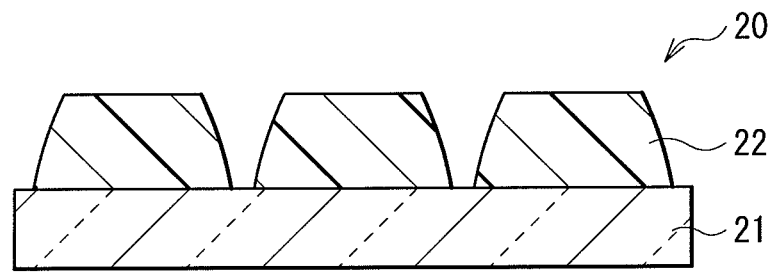
FIG. 20 is a sectional view illustrating a step following FIG. 19.

After that, as illustrated in FIG. 19, unloading is performed to open the shutter 74 and release the die 70. Therefore, as illustrated in FIG. 20, a plurality of optical function elements 22 having the same shape as that of the through hole 72 are allowed to be formed independently of one another directly on the base 21, and the formation of the residual film is preventable.

Figure 21:
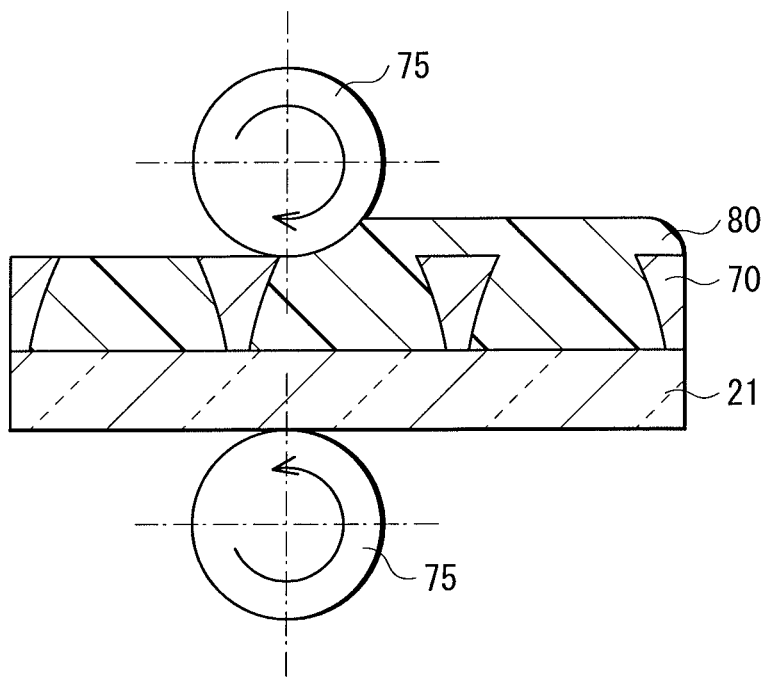
FIG. 21 is a sectional view illustrating a modification example of steps illustrated in FIG. 16(C) and FIG. 17(A).

In addition, in the above-described method of manufacturing the optical part 20, the case where after the ultraviolet-curable resin 80 is applied from the back surface 70B side of the die 70, the excessive ultraviolet-curable resin 80 extending to the back surface 70B of the die 70 is removed with use of, for example, the squeegee 73 is described; however, as illustrated in FIG. 21, the ultraviolet-curable resin 80 may be applied and pressurized simultaneously with use of a roller 75, and as illustrated in FIG. 17(B), the back surface 70B of the die 70 may be covered with the shutter 74 immediately. Therefore, steps are allowed to be simplified, and a cycle time is allowed to be reduced.

Figure 22:
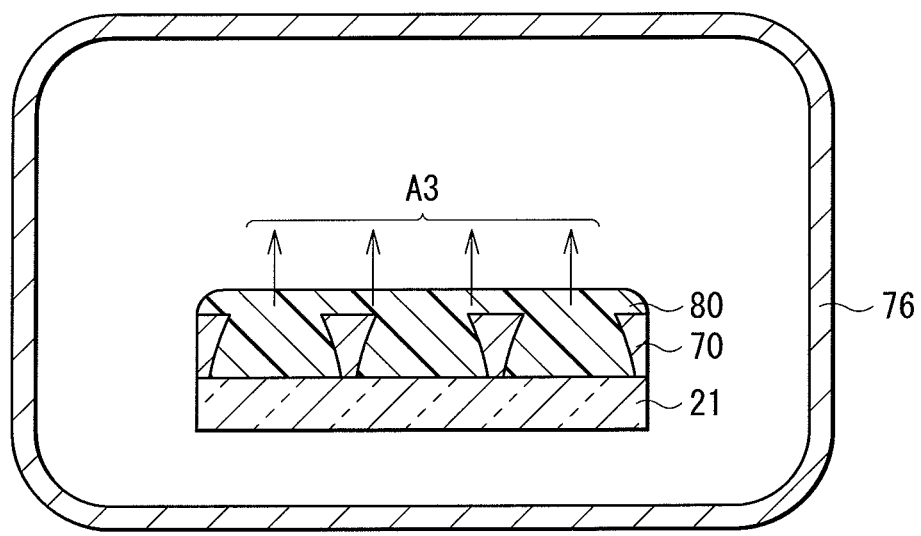
FIG. 22 is a sectional view illustrating a configuration of a vacuum chamber in which the steps illustrated in FIG. 16B to FIG. 19 are performed.

Moreover, air mixed into the ultraviolet curable resin 80 is removed in a defoaming step in advance, but to prevent an influence of air generated in a coating process or the like, as illustrated in FIG. 22, it is preferable to remove air as illustrated by arrows A3 by performing all steps in a vacuum chamber 76.

After the optical part 20 and the light-emitting panel 10 are formed in such a manner, the adhesive layer 30 is formed on the protective film 17 of the light-emitting panel 10, and the optical part 20 is arranged on the light extraction side (the second electrode 16 side) of the light-emitting panel 10 so that apical surfaces of the optical function elements 22 face the organic light-emitting elements 10R, 10G and 10B, respectively, and the optical part 20 is bonded to the light-emitting panel 10 with the adhesive layer 30. Thus, the display illustrated in FIGS. 4 to 6 is completed.

In the display, a scanning signal is supplied from the scanning line drive circuit 130 to each pixel through a gate electrode of the writing transistor Tr2, and an image signal supplied from the signal line drive circuit 120 through the writing transistor Tr2 is retained in the retention capacitor Cs. In other words, on/off control of the driving transistor Tr1 is performed in response to the signal retained in the retention capacitor Cs, and a drive current Id is thereby injected into each of the organic light-emitting elements 10R, 10G and 10B to emit light by the recombination of holes and electrons. The light passes through the second electrode 16 and the optical part 20 to be extracted.

More specifically, light emitted from the organic light-emitting elements 10R, 10G and 10B enters from the apical surfaces of the optical function elements 22 and is reflected from the reflecting mirror films (not illustrated) formed on the side surfaces of the optical function elements 22 to be extracted to outside. Therefore, light extraction efficiency is enhanced, and luminance is improved. In this case, a plurality of optical function elements 22 are formed independently of one another on the base 21; therefore, the residual film which is an optically unnecessary part between the base 21 and the plurality of optical function elements 22 is eliminated, and unnecessary light guiding, reflection or the like to the residual film is prevented. Therefore, in the display including the optical part 20, stray light due to unnecessary light guiding or reflection to the residual film is reduced, and an improvement in light extraction efficiency is achievable.

Thus, in the display of the example embodiment, a plurality of optical function elements 22 of the optical part 20 are formed independently of one another on the base 21; therefore, the residual film which is an optically unnecessary part between the base 21 and the plurality of optical function elements 22 is allowed to be eliminated. Therefore, stray light due to unnecessary light guiding or reflection to the residual film is reduced, and an improvement in light extraction efficiency is achievable.

Moreover, in the method of manufacturing the display of the example embodiment, the die 70 including a plurality of through holes 72 is formed, and the die 70 and the base 21 are superimposed on each other, and the ultraviolet-curable resin 80 is applied from the back surface 70B side of the die 70, and the ultraviolet-curable resin 80 extended to the back surface of the die 70 is removed; therefore, the optical function elements 22 are allowed to be formed independently of each other directly on the base without leaving the residual film. Therefore, the display of the example embodiment is allowed to be manufactured by simple steps by arranging the optical part 20 on the light extraction side of the light-emitting panel 10.

Further, the base 21 on which the color filter 23 and the light-shielding film 24 are arranged is used; therefore, the optical part 20 is allowed to have a function as a CF-integrated reflective plate formed by integrating the color filter 23 and the light-shielding film 24 into the optical part 20. Therefore, the number of components is allowed to be reduced, and the number of times of alignment for superimposition is allowed to be reduced: therefore, the method is advantageous in terms of manufacturing cost, takt time, yields and the like.

In addition, in the above-described example embodiment, the case where the optical function elements 22 are formed with use of the die 70 formed by electroforming is described: however, as a die for forming the optical function elements 22, in addition to the die 70 formed by electroforming, any other die such as a silica die formed by processing silica by RIE (Reactive Ion Etching) or the like, or a resin die formed by transfer-molding a fluorine-based resin or the like may be used.

Modification Example 1

Figure 23:
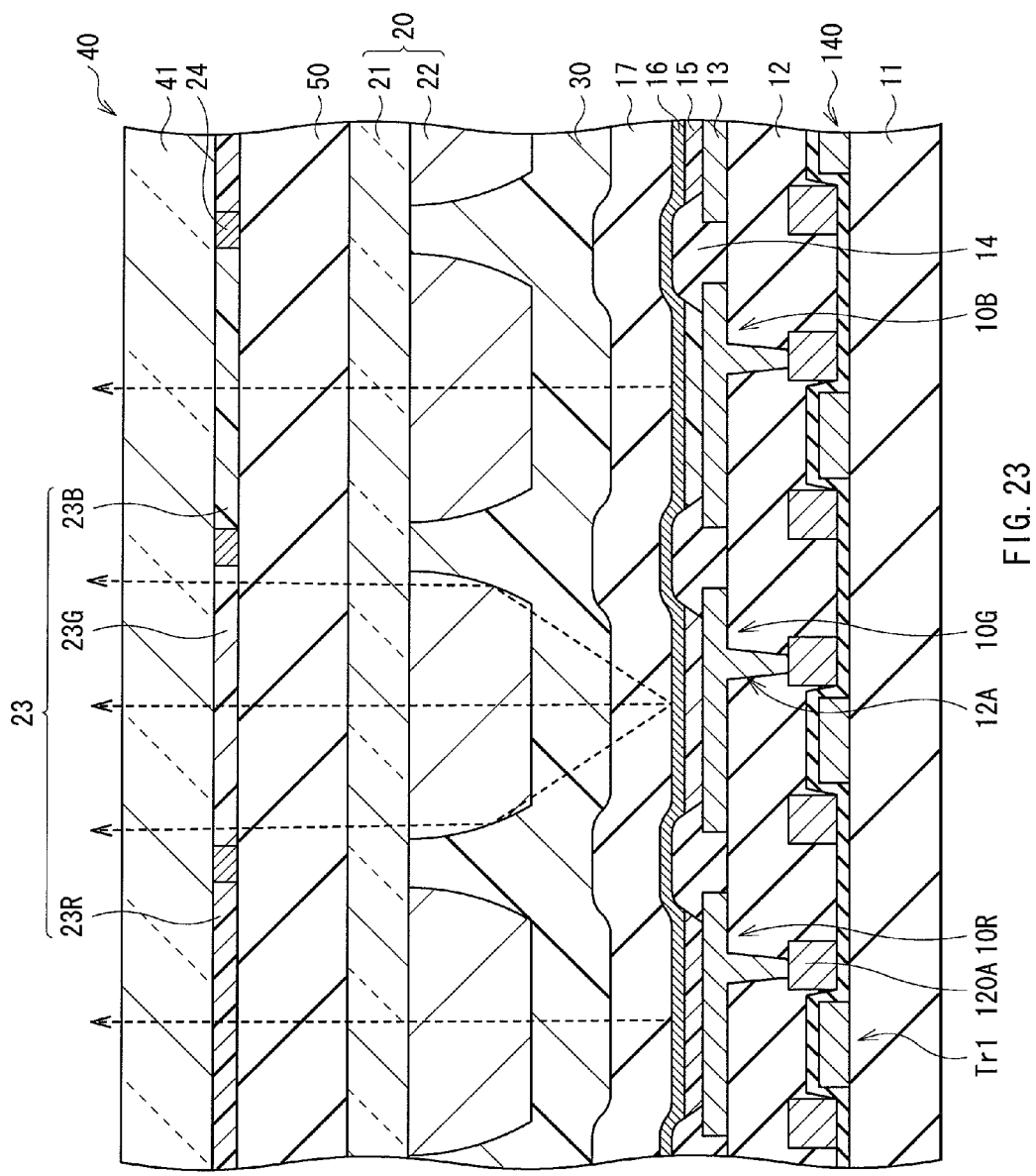
FIG. 23 is a diagram illustrating a configuration of a display according to Modification Example 1 of the disclosure.

FIG. 23 illustrates a sectional configuration of a display according to Modification Example 1 of the disclosure. The display has the same configuration as that in the above-described example embodiment, except that in addition to the optical part 20, a sealing panel 40 including the color filter 23 and the light-shielding film 24 on a sealing substrate 41 made of glass or the like is used. The optical part 20 and the sealing panel 40 are bonded together with an adhesive layer 50 made of a thermosetting resin or an ultraviolet curable resin. Note that only the color filter 23 may be included in the sealing panel 40, and the light-shielding film 24 may be removed.

The display is allowed to be manufactured by, for example, the following steps.

Figure 24:
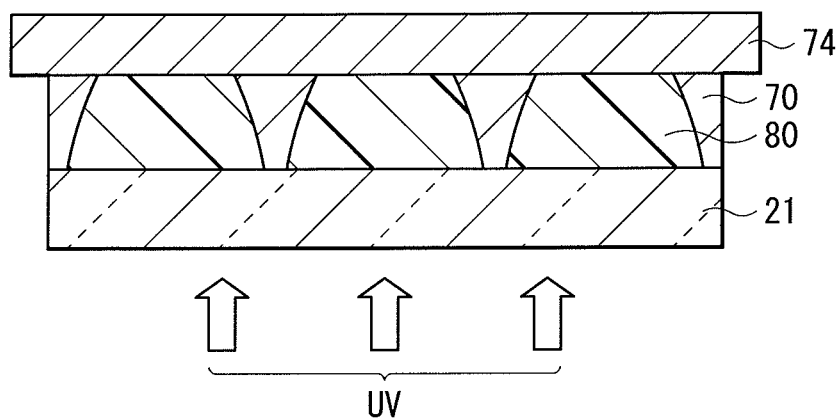
FIG. 24 is a sectional view illustrating one step of a method of manufacturing the display illustrated in FIG. 23.

First, as in the case of the above-described example embodiment, the light-emitting panel 10 is formed by the steps illustrated in FIGS. 8 to 11. Next, as in the case of the above-described example embodiment, the optical part 20 is formed by the steps illustrated in FIGS. 12 to 22. At this time, the base 21 not including the color filter 23 and the light-shielding film 24 thereon is used. Ultraviolet rays UV may be applied from the shutter 74 side according to the step illustrated in FIG. 18 as in the case of the above-described example embodiment, or the ultraviolet rays UV may be applied from a back side of the base 21 as illustrated in FIG. 24.

Next, the optical part 20 is arranged on the light extraction side (the second electrode 16 side) of the light-emitting panel 10 to be bonded to the light-emitting panel 10 with the adhesive layer 30. After that, the sealing substrate 41 is prepared, and as in the case of the above-described example embodiment, the color filter 23 and the light-shielding film 24 are formed by the steps illustrated in FIG. 15 to form the sealing panel 40. Finally, the adhesive layer 50 is formed on the optical part 20, and the optical part 20 and the sealing panel 40 are bonded together with the adhesive layer 50 in between. Thus, the display illustrated in FIG. 23 is completed.

Functions and effects of the modification example are the same as those in the above-described example embodiment.

Modification Example 2

Figure 25:
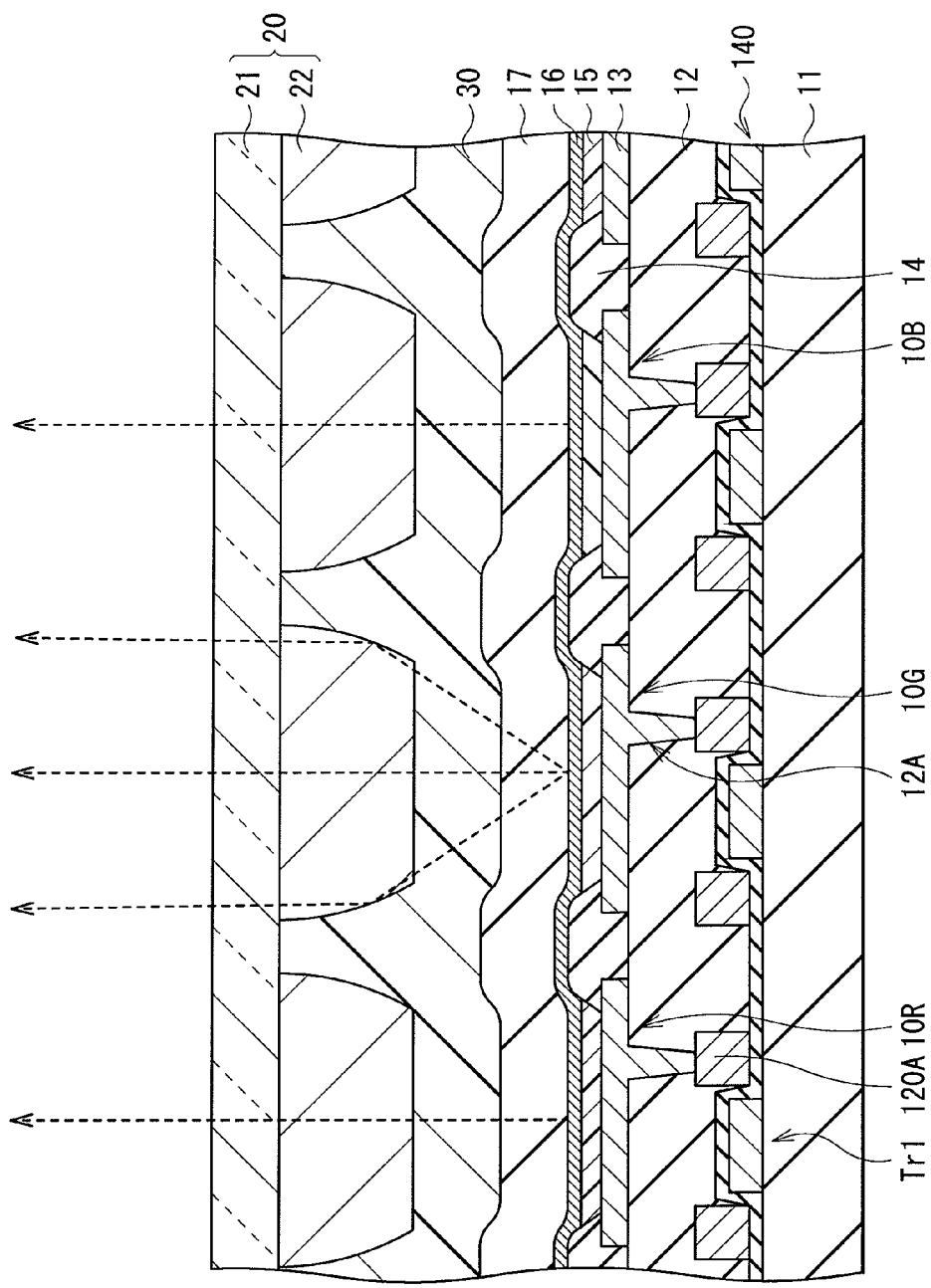
FIG. 25 is a diagram illustrating a configuration of a display according to Modification Example 2 of the disclosure.

FIG. 25 illustrates a sectional configuration of a display according to Modification Example 2 of the disclosure. The display has the same configuration, function and effects as those in the above-described example embodiment and is allowed to be manufactured in the same manner as that in the above-described example embodiment, except that the display has a CF-less configuration in which the color filter 23 and the light-shielding film 24 are not included.

Module and Application Examples

Application examples of the display described in the above-described example embodiment will be described below. The display according to the above-described example embodiment is applicable to displays of electronic devices displaying a picture signal supplied from outside or a picture signal produced inside as an image or a picture in any fields, such as televisions, digital cameras, notebook personal computers, portable terminal devices such as cellular phones, and video cameras.

Modules

Figure 26:
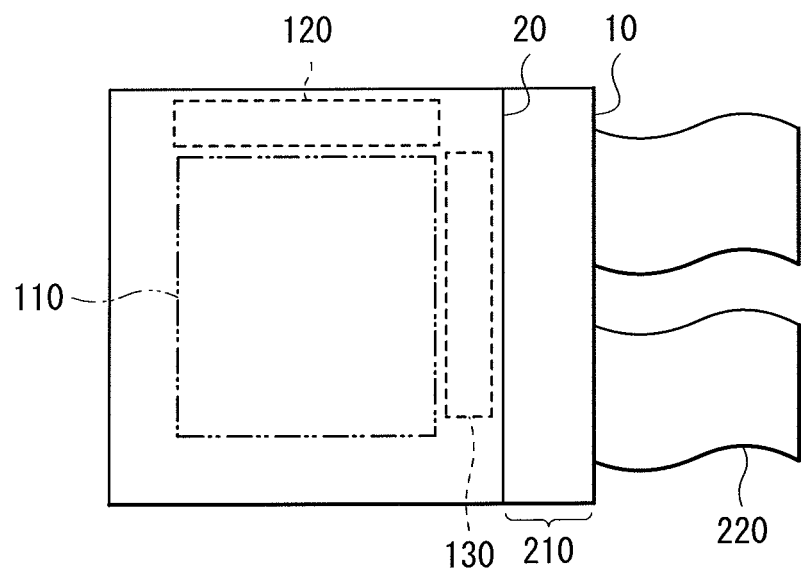
FIG. 26 is a plan view illustrating a schematic configuration of a module including the display of the above-described example embodiment.

The display of the above-described example embodiment is incorporated into various electronic devices such as Application Examples 1 to 5 which will be described later as a module as illustrated in FIG. 26. In the module, for example, a region 210 exposed from the optical part 20 and the adhesive layer 30 is arranged on a side of the substrate 11, and an external connection terminal (not illustrated) is formed in the exposed region 210 by extending the wiring of the signal line drive circuit 120 and the scanning line drive circuit 130. In the external connection terminal, a flexible printed circuit (FPC) 220 for signal input/output may be arranged.

Application Example 1

Figure 27:
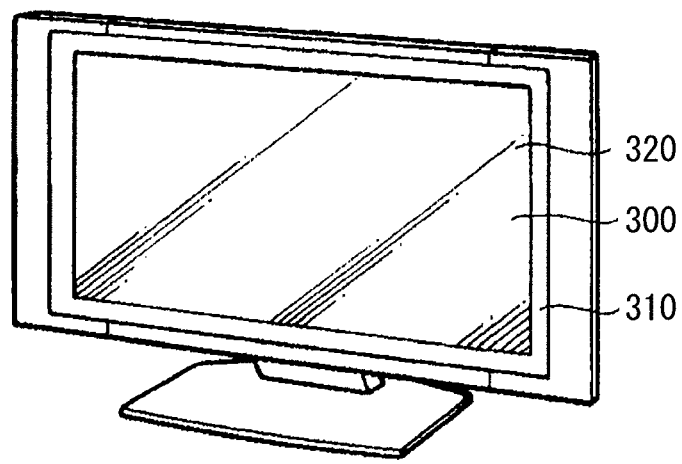
FIG. 27 is a perspective view illustrating an appearance of Application Example 1 of the display of the above-described example embodiment.

FIG. 27 illustrates an appearance of a television to which the display of the above-described example embodiment is applied. The television has, for example, a picture display screen section 300 including a front panel 310 and a filter glass 320, and the picture display screen section 300 is configured of the display of the above-described example embodiment.

Application Example 2

Figure 28:
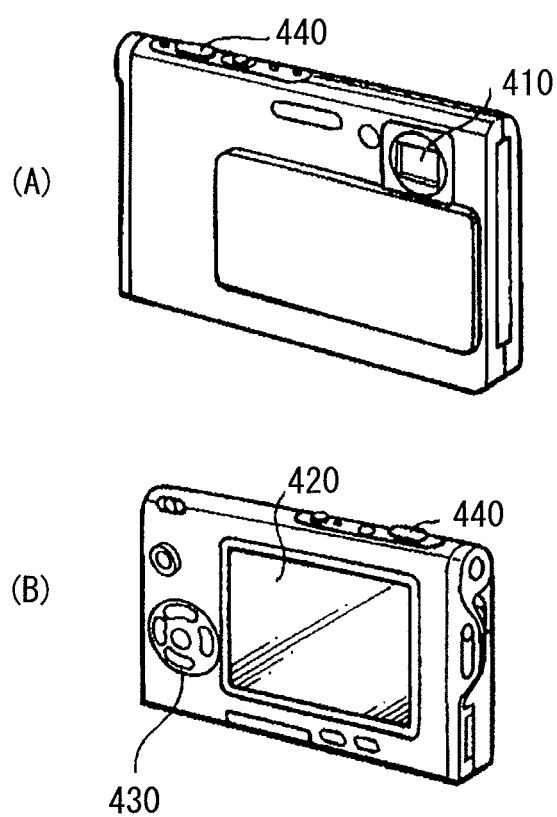
FIGS. 28(A) and 28(B) are perspective views illustrating an appearance of Application Example 2 from a front side and a back side, respectively.

FIG. 28 illustrates an appearance of a digital camera to which the display of the above-described example embodiment is applied. The digital camera has, for example, a light-emitting section for a flash 410, a display section 420, a menu switch 430, and a shutter button 440, and the display section 420 is configured of the display of the above-described example embodiment.

Application Example 3

Figure 29:
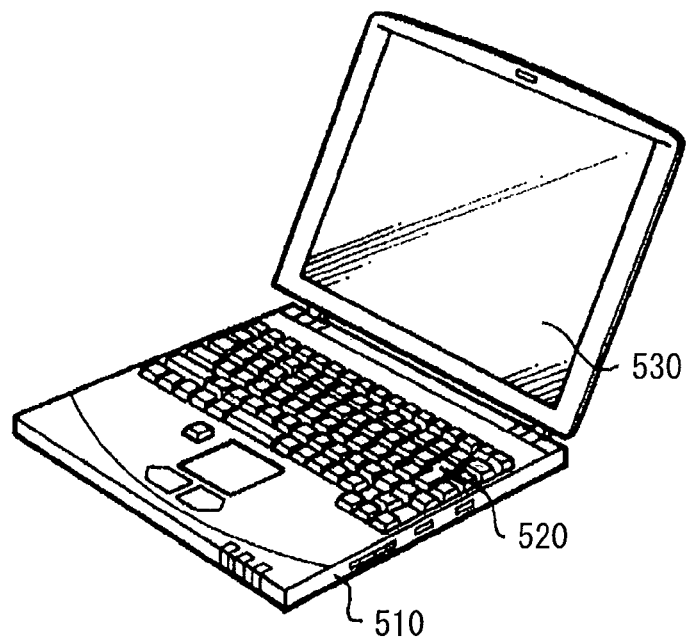
FIG. 29 is a perspective view illustrating an appearance of Application Example 3.

FIG. 29 illustrates an appearance of a notebook personal computer to which the display of the above-described example embodiment is applied. The notebook personal computer has, for example, a main body 510, a keyboard 520 for operation of inputting characters and the like, a display section 530 for displaying an image, and the display section 530 is configured of the display of the above-described example embodiment.

Application Example 4

Figure 30:
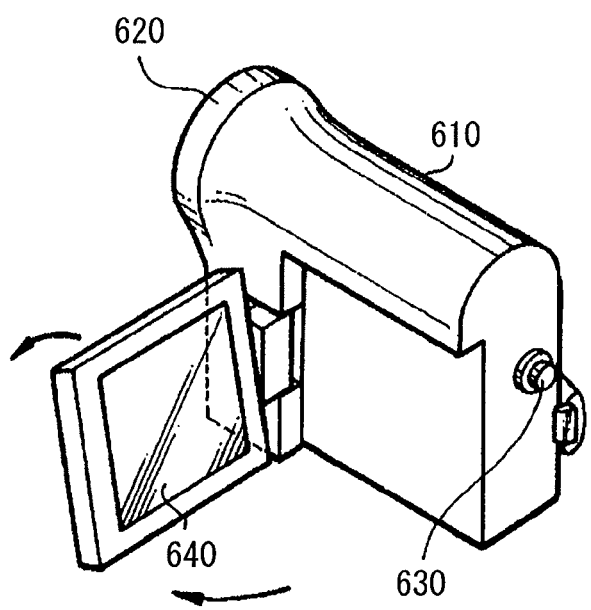
FIG. 30 is a perspective view illustrating an appearance of Application Example 4.

FIG. 30 illustrates an appearance of a video camera to which the display of the above-described example embodiment is applied. The video camera has, for example, a main body 610, a lens for shooting an object 620 arranged on a front surface of the main body 610, a shooting start/stop switch 630, and a display section 640, and the display section 640 is configured of the display of the above-described example embodiment.

Application Example 5

Figure 31:
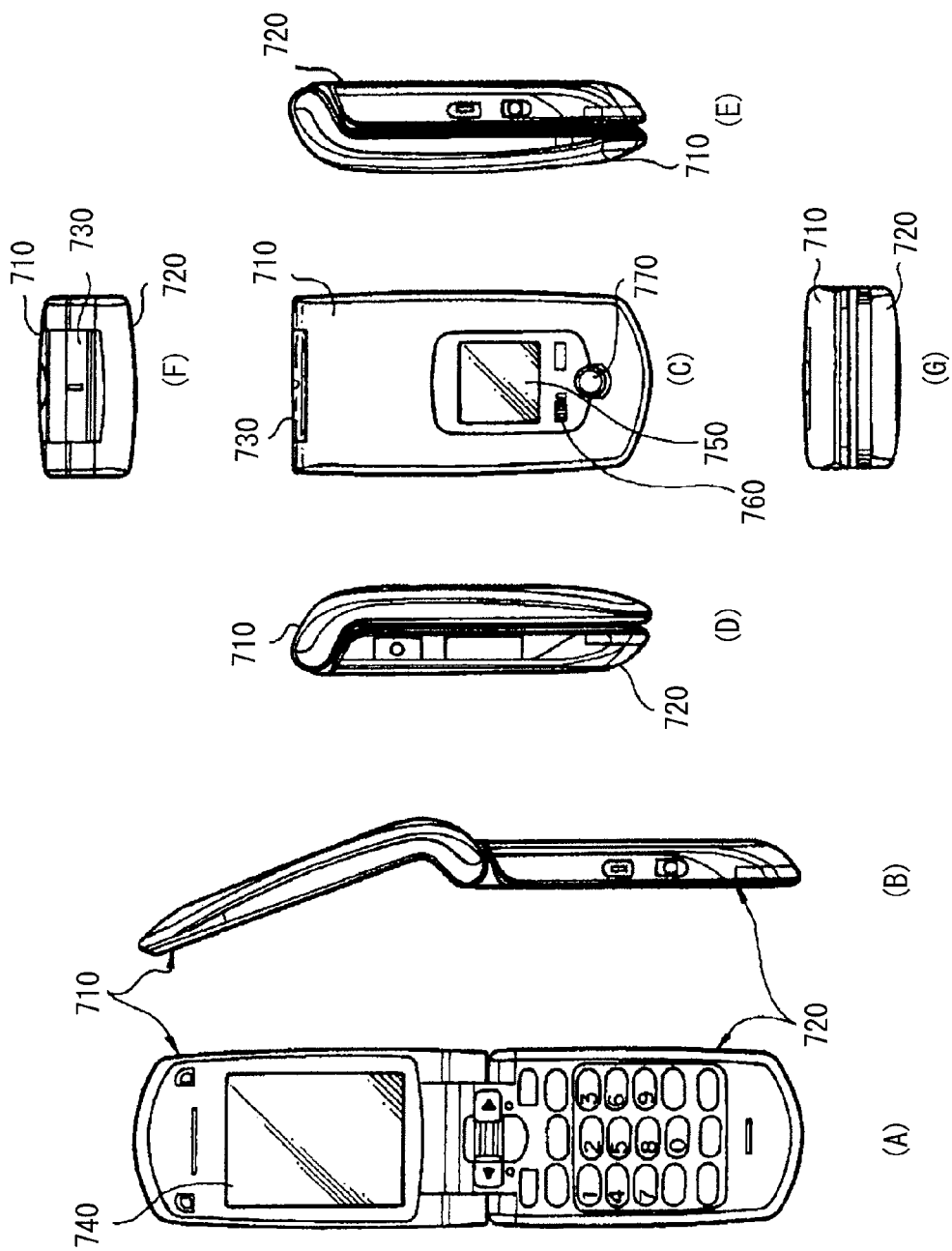
FIG. 31 illustrates Application Example 5, (A) and (B) are a front view and a side view in a state in which Application Example 5 is opened, respectively, and (C), (D), (E), (F) and (G) are a front view, a left side view, a right side view, a top view and a bottom view in a state in which Application Example 5 is closed, respectively.

FIG. 31 illustrates an appearance of a cellular phone to which the display of the above-described example embodiment is applied. The cellular phone is formed by connecting, for example, a top-side enclosure 710 and a bottom-side enclosure 720 to each other by a connection section (hinge section) 730. The cellular phone has a display 740, a sub-display 750, a picture light 760, and a camera 770. The display 740 or the sub-display 750 is configured of the display of the above-described example embodiment.

Although the present disclosure is described referring to the example embodiment, the disclosure is not limited thereto, and may be variously modified. For example, in the above-described example embodiment, the case where the optical part 20 is applied to the reflective plate (reflector) of the display is described; however, the optical part 20 is also applicable to a diffusion plate in addition to the reflective plate. Moreover, as the optical function elements 22, trapezoidal prisms or the like may be formed.

Further, in the above-described example embodiment, the case where the optical function elements 22 each have a truncated cone shape is described: however, the shape of the optical function element 22 may be, for example, any other three-dimensional shape such as a dot shape (a cylindrical shape, a hemispherical shape or an aspherical shape like a microlens) or a parabolic bell shape depending on the application of the optical part 20, and is not specifically limited. Moreover, the shape of the optical function element 22 is not limited to a three-dimensional shape, and may be a two-dimensional shape such as a linear pattern of a triangular projection shape such as a prism.

Further, for example, the material and thickness of each layer, the method and conditions of forming each layer are not limited to those described in the above-described example embodiment, and each layer may be made of any other material with any other thickness by any other method under any other conditions.

In addition, in the above-described example embodiment, the configurations of the organic light-emitting elements 10R, 10B and 10G are specifically described; however, all layers are not necessarily included, or any other layer may be further included.

Moreover, the disclosure is also applicable to a self-luminous device using any other self-luminous element such as an LED (Light Emitting Diode), an FED (Field Emission Display) or an inorganic electroluminescence element in addition to the organic light-emitting element.

In addition, the display of the disclosure is applicable to any light-emitting device for any purpose other than display, such as a lighting device.

The present application contains subject matter related to that disclosed in Japanese Priority Patent Application JP 2008-252970 filed in the Japan Patent Office on Sep. 30, 2008, the entire content of which is hereby incorporated by reference.

It should be understood that various changes and modifications to the presently preferred example embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A method of manufacturing an optical part, the method comprising:
   (a) forming a die including a plurality of through holes;
   (b) superimposing the die and a base on each other so that a front surface of the die is in contact with the base and applying an uncured material from a back surface of the die, a width of the through holes narrowing in a thickness direction of the die from the front surface of the die to the back surface of the die;
   (c) removing the uncured material extended to the back surface of the die;
   (d) curing the uncured material in the plurality of through holes to form a plurality of optical function elements independently of one another on the base; and
   (e) removing the die.

2. The method of claim 1, wherein as the base, a base including a color filter thereon is used.

3. The method of claim 1, wherein forming the die includes:
   (a) forming a die including a plurality of depressions on a front surface thereof; and
   (b) removing a part between a back surface of the die and bottom surfaces of the plurality of depressions to transform the plurality of depressions into a plurality of through holes.

4. The method of claim 1, wherein after the step of removing the uncured material, an upper surface of the uncured material is substantially coplanar with an upper surface of the die.

5. The method of claim 1, wherein forming the die includes forming a plurality of depressions into a die substrate, and removing a back part of the die to transform the depressions into a plurality of the through holes.

6. The method of claim 5, wherein the step of superimposing the die and the base on each other is performed after the through holes in the die have been formed.

7. A method of manufacturing a display comprising:
   (a) forming a light-emitting panel including a plurality of self-luminous elements on a substrate;
   (b) forming an optical part; and
   (c) arranging the optical part on a light extraction side of the light-emitting panel, wherein forming the optical part includes:
      (i) forming a die including a plurality of through holes;
      (ii) superimposing the die and a base on each other so that a front surface of the die is in contact with the base and applying an uncured material from a back surface of the die, a width of the through holes narrowing in a thickness direction of the die from the front surface of the die to the back surface of the die;
      (iii) removing the uncured material extended to the back surface of the die;
      (iv) curing the uncured material in the plurality of through holes to form a plurality of optical function elements independently of one another on the base; and
      (v) removing the die.

8. The method of claim 7, wherein as the base, a base including a color filter thereon is used.

9. The method of claim 7, wherein forming the die includes:
   (a) forming a die including a plurality of depressions on a front surface thereof; and
   (b) removing a part between a back surface of the die and bottom surfaces of the plurality of depressions to transform the plurality of depressions into a plurality of through holes.

* * * * *